(12) United States Patent
Dyer et al.

(10) Patent No.: US 9,105,791 B1
(45) Date of Patent: Aug. 11, 2015

(54) TUNABLE PLASMONIC CRYSTAL

(71) Applicants: Sandia Corporation, Albuquerque, NM (US); The Research Foundation of the City University of New York, New York, NY (US)

(72) Inventors: Gregory Conrad Dyer, Albuquerque, NM (US); Eric A. Shaner, Rio Rancho, NM (US); John L. Reno, Albuquerque, NM (US); Gregory Aizin, East Brunswick, NJ (US)

(73) Assignees: Sandia Corporation, Albuquerque, NM (US); The Research Foundation of the City University of New York, New York, NY (US)

( * ) Notice: Subject to any disclaimer, the term of this patent is extended or adjusted under 35 U.S.C. 154(b) by 0 days.

(21) Appl. No.: 14/028,137

(22) Filed: Sep. 16, 2013

(51) Int. Cl.
*H01L 31/112* (2006.01)

(52) U.S. Cl.
CPC .................................. *H01L 31/1127* (2013.01)

(58) Field of Classification Search
CPC .................................................... H01L 31/1127
See application file for complete search history.

(56) References Cited

U.S. PATENT DOCUMENTS 7,376,403 B1 * 5/2008 Wanke et al. ............... 455/189.1
7,915,641 B2 * 3/2011 Otsuji et al. .................. 257/192

OTHER PUBLICATIONS

Dyakonov et al., "Shallow Water Analogy for Ballistic Field Effect Transistor: New Mechanism of Plasma Wave Generation by dc Current", vol. 71, No. 15, Physical Review Letters, Oct. 11, 1993, pp. 2465-2468.*
Allen, S.J.,Jr., et al., "Observation of the Two-Dimensional Plasmon in Silicon Inversion Layers", Physical Review Letters, 1977, pp. 980-983, vol. 38, No. 17.
Dyakonov, M. et al., "Detection, Mixing, and Frequency Multiplication of Terahertz Radiation by Two-Dimensional Electronic Fluid", IEEE Transactions on Electron Devices, 1996, pp. 380-387, vol. 43, No. 3.
Ju, L. et al., "Graphene plasmonics for tunable terahertz metamaterials", Nature Nanotechnology, 2011, pp. 630-634, vol. 6.
Yan, H. et al., "Tunable infrared plasmonic devices using graphene/insulator stacks", Nature Nanotechnology, 2012, pp. 330-334, vol. 7.
Grigorenko, A. N. et al., "Graphene plasmonics", Nature Photonics, 2012, pp. 749-757, vol. 6.
Mackens, U. et al., "Minigaps in the Plasmon Dispersion of a Two-Dimensional Electron Gas with Spatially Modulated Charge Density", Physical Review Letters, 1984, pp. 1485-1488, vol. 53, No. 15.
Muravev, V.M. et al., "Tunable Plasmonic Crystals for Edge Magnetoplasmons of a Two-Dimensional Electron System", Physical Review Letters, 2008, pp. 216801-1-216801-4, vol. 101.

(Continued)

*Primary Examiner* — William Coleman
(74) *Attorney, Agent, or Firm* — Kevin W. Bieg

(57) ABSTRACT

A tunable plasmonic crystal comprises several periods in a two-dimensional electron or hole gas plasmonic medium that is both extremely subwavelength (~$\lambda/100$) and tunable through the application of voltages to metal electrodes. Tuning of the plasmonic crystal band edges can be realized in materials such as semiconductors and graphene to actively control the plasmonic crystal dispersion in the terahertz and infrared spectral regions. The tunable plasmonic crystal provides a useful degree of freedom for applications in slow light devices, voltage-tunable waveguides, filters, ultra-sensitive direct and heterodyne THz detectors, and THz oscillators.

10 Claims, 11 Drawing Sheets

(56) References Cited

OTHER PUBLICATIONS

Dyer, G.C. et al., "Inducing an Incipient Terahertz Finite Plasmonic Crystal in Coupled Two Dimensional Plasmonic Cavities", Physical Review Letters, 2012, pp. 126803-1-126803-5, vol. 109.

Andress, W.F. et al., "Ultra-Subwavelength Two-Dimensional Plasmonic Circuits", Nano Letters, 2012, pp. 2272-2277, vol. 12.

Luk'Yanchuk, B. et al., "The Fano resonance in plasmonic nanostructures and metamaterials", Nature Materials, 2010, pp. 707-715, vol. 9.

Totsuka, K. et al., "Slow Light in Coupled-Resonator-Induced Trasnparency", Physical Review Letters, 2007, pp. 213904-1-213904-4, vol. 98.

Chen, J. et al., "Optical nano-imaging of gate-tunable graphene plasmons", Nature, 2012, pp. 77-81, vol. 487.

Fei, Z. et al., "Gate-tuning of graphene plasmons revealed by infrared nano-imaging", Nature, 2012, p. 82, vol. 487.

Davoyan, A.R. et al., "Tailoring Terahertz Near-Field Enhancement via Two-Dimensional Plasmons", Physical Review Letters, 2012, pp. 127401-1-127401-5, vol. 108.

Sydoruk, O. et al., "Distributed gain in plasmonic reflectors and its use for terahertz generation", Optics Express 2012, pp. 19618-19627, vol. 20, No. 18.

Rana, F. et al., "Graphene Terahertz Plasmon Oscillators", IEEE Transactions on Nanotechnology, 2008, pp. 91-99, vol. 7, No. 1.

Staffaroni, M. et al., "Circuit analysis in metal-optics", Photonics and Nanostructures—Fundamentals and Applications, 2012, pp. 166-176, vol. 10.

Aizin, G.R. et al., "Transmission line theory of collective plasma excitations in periodic two-dimensional electron systems: Finite plasmonic crystals and Tamm states", Physical Review B, 2012, pp. 235316-1-235316-11, vol. 86.

Shaner, E.A. et al., "Far-Infrared Spectrum Analysis Using Plasmon Modes in a Quantum-Well Transistor", IEEE Photonics Technology Letters, 2006, pp. 1925-1927, vol. 18, No. 18.

Dyer, G.C. et al., "Enhanced performance of resonant sub-terahertz detection in a plasmonic cavity", Applied Physics Letters, 2012, pp. 083506-1-083506-4, vol. 100.

Muravev, V.M. et al., "Plasmonic detector/spectrometer of subterahertz radiation based on two-dimensional electron system with embedded defect", Applied Physics Letters, 2012, pp. 080212-1-082102-3, vol. 100.

Lisauskas, A. et al., "Rational design of high-responsivity detectors of terahertz radiation based on distributed self-mixing in silicon field-effect transistors", Applied Physics Letters, 2009, pp. 114511-1-114511-7, vol. 105.

Preu, S. et al. "An improved model for non-resonant terahertz detection in field-effect transistors", Journal of Applied Physics, 2012, pp. 024502-1-024502-9, vol. 111.

Klimenko, O. A. et al., "Temperature enhancement of terahertz responsivity of plasma field effect transistors", Journal of Applied Physics, 2012, pp. 014506-1-014506-5, vol. 112.

Ohno, H. et al., "Observation of "Tamm States" in Superlattices", Physical Review Letters, 1990, pp. 2555-2558, vol. 64, No. 21.

Goto, T. et al., "Optical Tamm States in One-Dimensional Magnetophonic Structures", Physical Review Letters, 2008, pp. 113902-1-113902-3, vol. 101.

Gazzano, O. et al., "Evicence for Confined Tamm Plasmon Modes under Metallic Microdisks and Application to the Control of Spontaneous Optical Emission", Physical Review Letters, 2011, pp. 247402-1-247402-5, vol. 107.

Preu, S et al., "Terahertz Detection by a Homodyne Field Effect Transistor Multiplicative Mixer", IEEE Transactions on Terahertz Science and Technology, 2012, pp. 278-283, vol. 2, No. 3.

\* cited by examiner

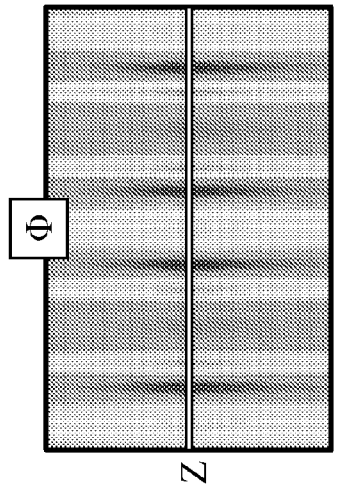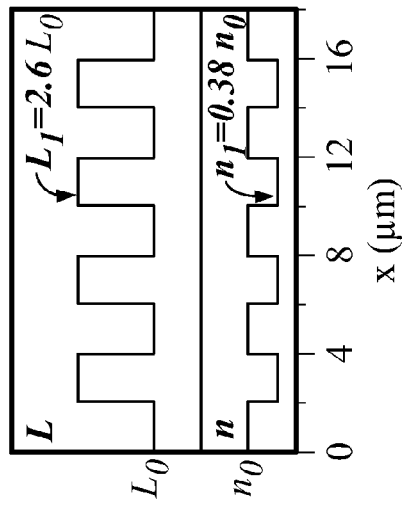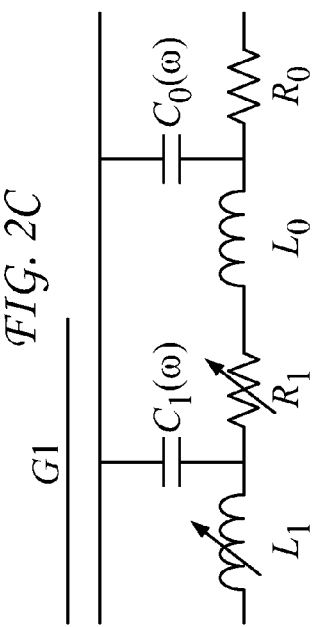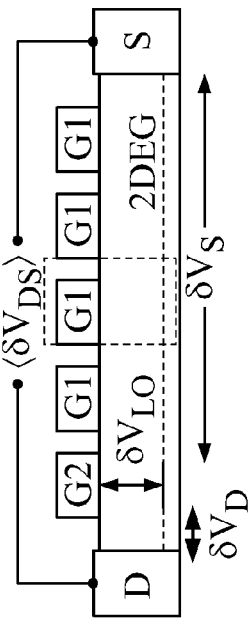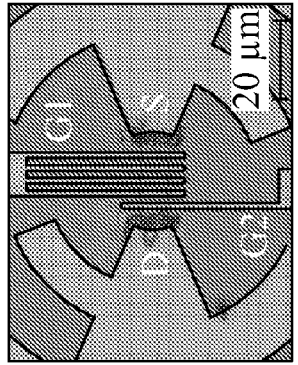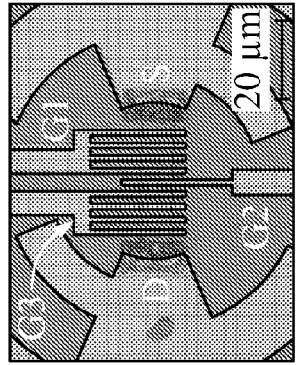

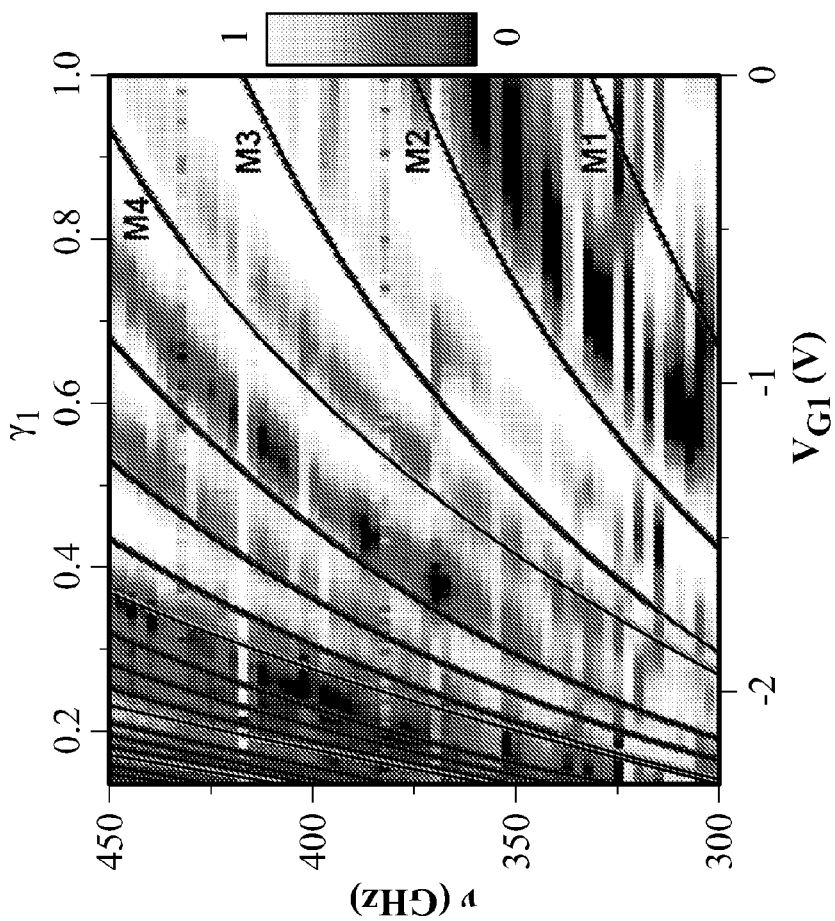
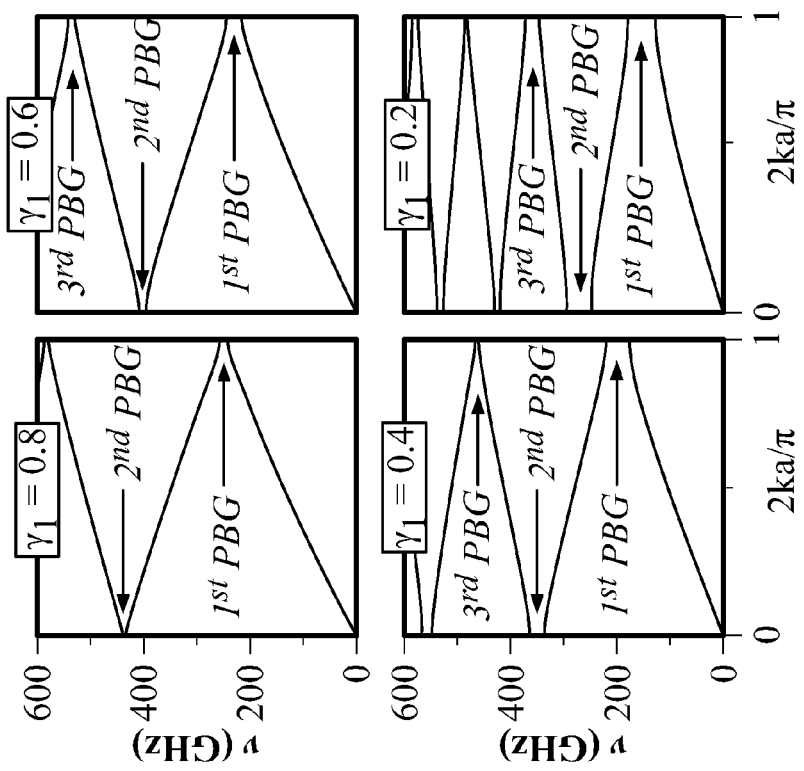
FIG. 3A
FIG. 3B

TUNABLE PLASMONIC CRYSTAL

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to photonic band gap structures and, in particular, to a tunable plasmonic crystal.

BACKGROUND OF THE INVENTION

Photonic band gaps, strong light-matter interaction, slow light, and negative refractive index arise in photonic crystal structures due to Bragg scattering of electromagnetic waves from a repeated unit cell. See E. Yablonovitch et al., *Phys. Rev. Lett.* 67, 2295 (1991); T. Yoshie et al., *Nature* 432, 200 (2004); T. Baba, *Nature Photon.* 2, 465 (2008); A. Berrier et al., *Phys. Rev. Lett.* 93, 073902 (2004); E. Yablonovitch, *Phys. Rev. Lett.* 58, 2059 (1987); and S. John, *Phys. Rev. Lett.* 58, 2486 (1987). However, the electromagnetic properties of photonic crystals engineered from bulk semiconductors, metals, and dielectrics generally are weakly tunable, if at all. Material systems such two-dimensional electron gases (2DEGs) embedded in semiconductors and graphene offer a substantially more flexible electromagnetic medium. See S. J. Allen et al., *Phys. Rev. Lett.* 38, 980 (1977); M. I. Dyakonov and M. S. Shur, *IEEE Trans. on Electron Devices* 43, 380 (1996); L. Ju et al., *Nature Nano.* 6, 630 (2011); H. Yan et al., *Nature Nano.* 7, 330 (2012); and A. N. Grigorenko et al., *Nature Photon.* 6, 749 (2012). These plasmonic materials can both be lithographically patterned and electronically tuned, giving rise to a variety of subwavelength plasmonic devices that may be broadly controlled via an applied DC electric field. When a periodic structure is engineered from these systems, a plasmonic band structure can be realized. See U. Mackens et al., *Phys. Rev. Lett.* 53, 1485 (1984); V. M. Muravev et al., *Phys. Rev. Lett.* 101, 216801 (2008); G. C. Dyer et al., *Phys. Rev. Lett.* 109, 126803 (2012); and W. F. Andress et al., *Nano Lett.* 12, 2272 (2012).

However, a need remains for a tunable plasmonic band structure, i.e., a tunable plasmonic crystal. The present invention provides widely tunable plasmonic band gap structures using a two-dimensional electron or hole gas in semiconductors or graphene.

SUMMARY OF THE INVENTION

The present invention is directed to a tunable plasmonic crystal, comprising a layer providing a two-dimensional electron gas (2DEG) or a two-dimensional hole gas (2DHG); a periodic gate comprising at least two parallel finger electrodes disposed on the 2DEG or 2DHG layer; and means for applying a gate voltage to the periodic gate to modulate the electron density in the 2DEG layer or the hole density in the 2DHG layer, thereby producing a spatially periodic plasmon structure having a unit cell; wherein the spatially periodic plasmon structure produces a plasmonic band structure when interacting with incident electromagnetic radiation and wherein the applied gate voltage is preferably sufficient to produce at least one bandgap in the plasmonic band structure. The layer providing the 2DEG or the 2DHG can be formed at a semiconductor heterojunction formed between two semiconductor materials having different band gaps, such as GaAs/AlGaAs, InGaAs/InAlAs, GaN/AlGaN, or GaSb/InAs, or an atomically thin material having high electron mobility or high hole mobility, such as graphene. The unit cell of the periodic plasmon structure is preferably less than $1/10$ and, more preferably, less than $1/100$ the free space wavelength of the incident electromagnetic radiation. The incident electromagnetic radiation can have a frequency of between 10 GHz and 60 THz (i.e., free space wavelength of between 30 mm and 5 μm). The incident electromagnetic radiation can be coupled to the tunable plasmonic crystal by an antenna or an on-chip signal generator. The tunable plasmonic crystal can further comprise at least one finger electrode disposed on the 2DEG or 2DHG layer biased at a different voltage than the gate voltage, thereby forming a plasmonic defect in the tunable plasmonic crystal.

BRIEF DESCRIPTION OF THE DRAWINGS

The detailed description will refer to the following drawings, wherein like elements are referred to by like numbers.

FIG. 1($b$) is a top-view schematic illustration of a tunable plasmonic crystal comprising a plasmonic defect.

FIGS. 2($a$) and 2($b$), show exemplary integrated plasmonic crystal structures. FIG. 2($a$) is an image of Sample A. FIG. 2($b$) is an image of Sample B. FIG. 2($c$) shows the equivalent distributed circuit for the PC unit cell of the samples with gated and ungated region elements below G1. FIG. 2($d$) is a schematic cross-sectional illustration of Sample A showing the coupling of fields to the plasmonic mixer induced below G2 with the depleted region shown in red and the 2DEG indicated by the blue dashed line. FIG. 2($e$) shows the distribution in the x-z plane of the potential Φ near the plane of the 2DEG plotted for a resonance ($L_1=2.6L_0$, $\nu=456$ GHz) of the PC formed between G2 and S. Shown below are the equilibrium 2DEG inductance L and density n of the PC.

FIG. 3($a$) is a graph of the frequency-wavevector dispersion of the plasmonic crystal based on the unit cell in FIG. 2($c$), plotted for normalized 2DEG densities $\gamma_1=0.8, 0.6, 0.4$ and 0.2. Only positive wavevectors are shown. FIG. 3($b$) shows the self-normalized PC photovoltage spectrum of Sample A as a function of $V_{G1}$ and frequency. The calculated PC modes are shown as solid lines.

FIGS. 4($b$), 4($d$), and 4($f$) are plots of the plasmonic photovoltage spectra of Sample B as a function of $V_{G1}$ and $V_{G2}$ for 302.5, 363.0 and 420.5 GHz excitation frequencies, respectively. FIGS. 4($c$), 4($e$), and 4($g$) are plots of the calculated band gaps (vertical shaded regions) of the infinite PC and the PC-PD system modes (solid lines) for 302.5, 363.0 and 420.5 GHz excitation frequencies, respectively.

FIG. 5($b$) is a graph of the spatial voltage distributions in the plane of the 2DEG for M1 and M2 with several detunings.

DETAILED DESCRIPTION OF THE INVENTION

Photonic crystals and metamaterials have emerged as two classes of tailorable materials that enable precise control of light. Plasmonic crystals, which can be thought of as photonic crystals fabricated from plasmonic materials, Bragg scatter incident electromagnetic waves from a repeated unit cell. However, plasmonic crystals, like metamaterials, are composed of subwavelength unit cells. The present invention is directed to tunable plasmonic crystals of several periods in a two-dimensional electron or hole gas. This plasmonic medium is both extremely subwavelength (∼λ/100) and tunable through the application of voltages to metal electrodes. Weakly localized crystal surface states known as Tamm states are observed. By introducing an independently controlled plasmonic defect that interacts with the Tamm states, a frequency agile electromagnetically induced transparency phenomenon can be achieved. In-situ tuning of the plasmonic crystal band edges can be realized in materials such as semiconductors and graphene to actively control the plasmonic crystal dispersion in the terahertz and infrared spectral regions.

The band structure, as well as coupled surface and defect states, in exemplary tunable PC structures are described below. Both photonic crystals and strongly coupled resonators can be harnessed for slow light applications, and tunable plasmonic systems provide a useful degree of freedom for possible slow light devices. See T. Baba, *Nature Photon.* 2, 465 (2008); B. Luk'yanchuk et al., *Nature Mater.* 9, 707 (2010); and K. Totsuka et al., *Phys. Rev. Lett.* 98, 213904 (2007). More broadly, plasmonic crystals can be integrated as voltage-tunable waveguides and filters in photonic crystals. While the exemplary plasmonic devices based upon GaAs/AlGaAs heterostructures can be limited in both operating temperature (<77 K) and operating frequency (<1 THz), both GaN-based 2DEGs and graphene can be used to extend the range of the PC-based structures. For example, recent studies have shown tunable THz plasmons in GaN 2DEGs above 77 K and at room temperature in graphene, as well as mid-infrared plasmons in graphene nanostructures. See L. Ju et al., *Nature Nano.* 6, 630 (2011); H. Yan et al., *Nature Nano.* 7, 330 (2012); J. Chen et al., *Nature* 487, 77 (2012); and Z. Fei et al., *Nature* 487, 82 (2012). The manipulation of the localized PC defect and Tamm state field distributions to produce strong field enhancements can provide a new generation of ultra-sensitive direct and heterodyne THz detectors as well as THz oscillators. See A. R. Davoyan et al., *Phys. Rev. Lett.* 108, 127401 (2012); and O. Sydoruk et al., *Opt. Express* 20, 19618 (2012). Finally, plasmonic crystals can have filtering and waveguiding applications for microwave and THz signals.

Figure 1A:
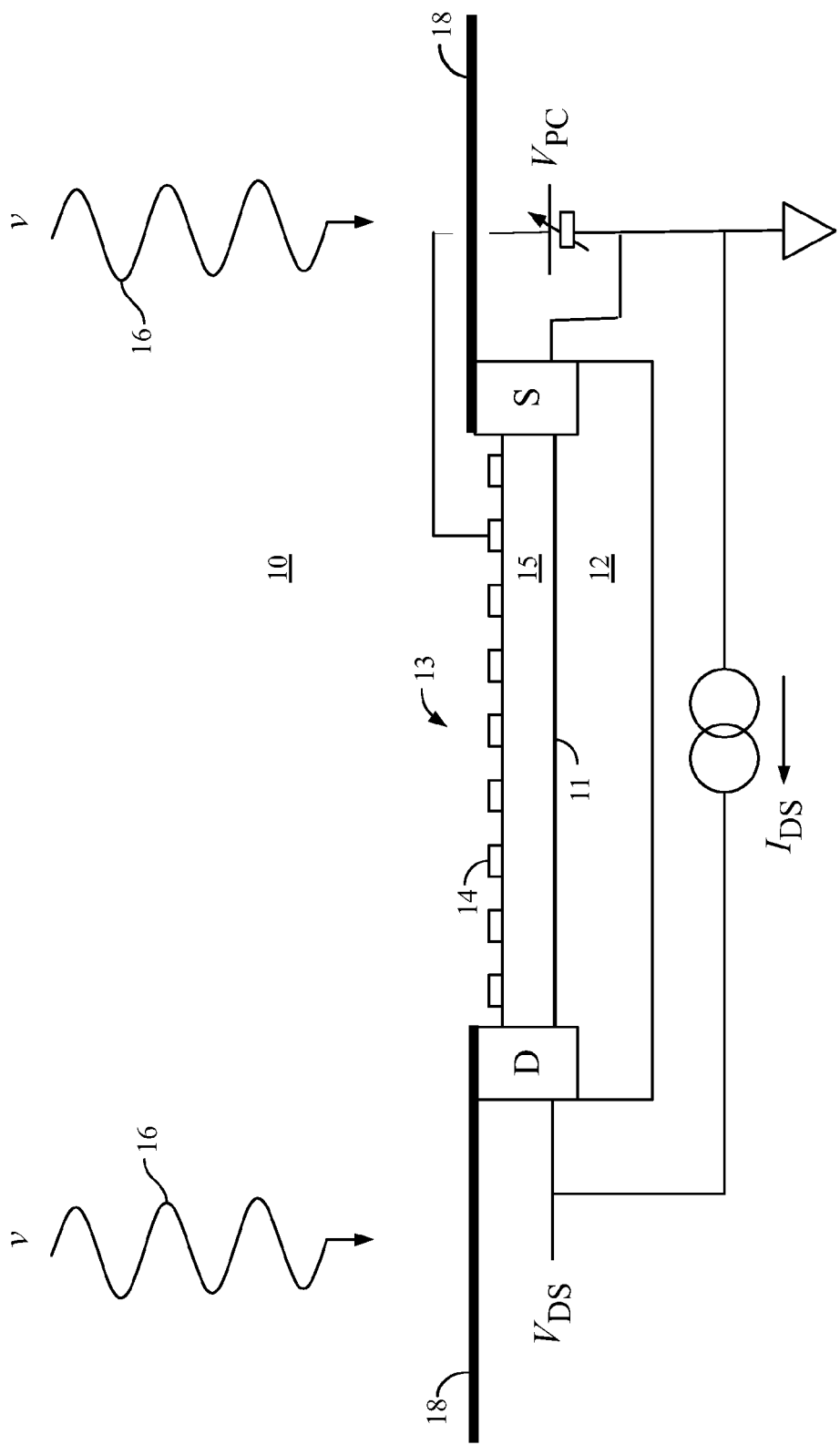
FIG. 1($a$) is a side-view schematic illustration of a tunable plasmonic crystal.
Figure 1B:
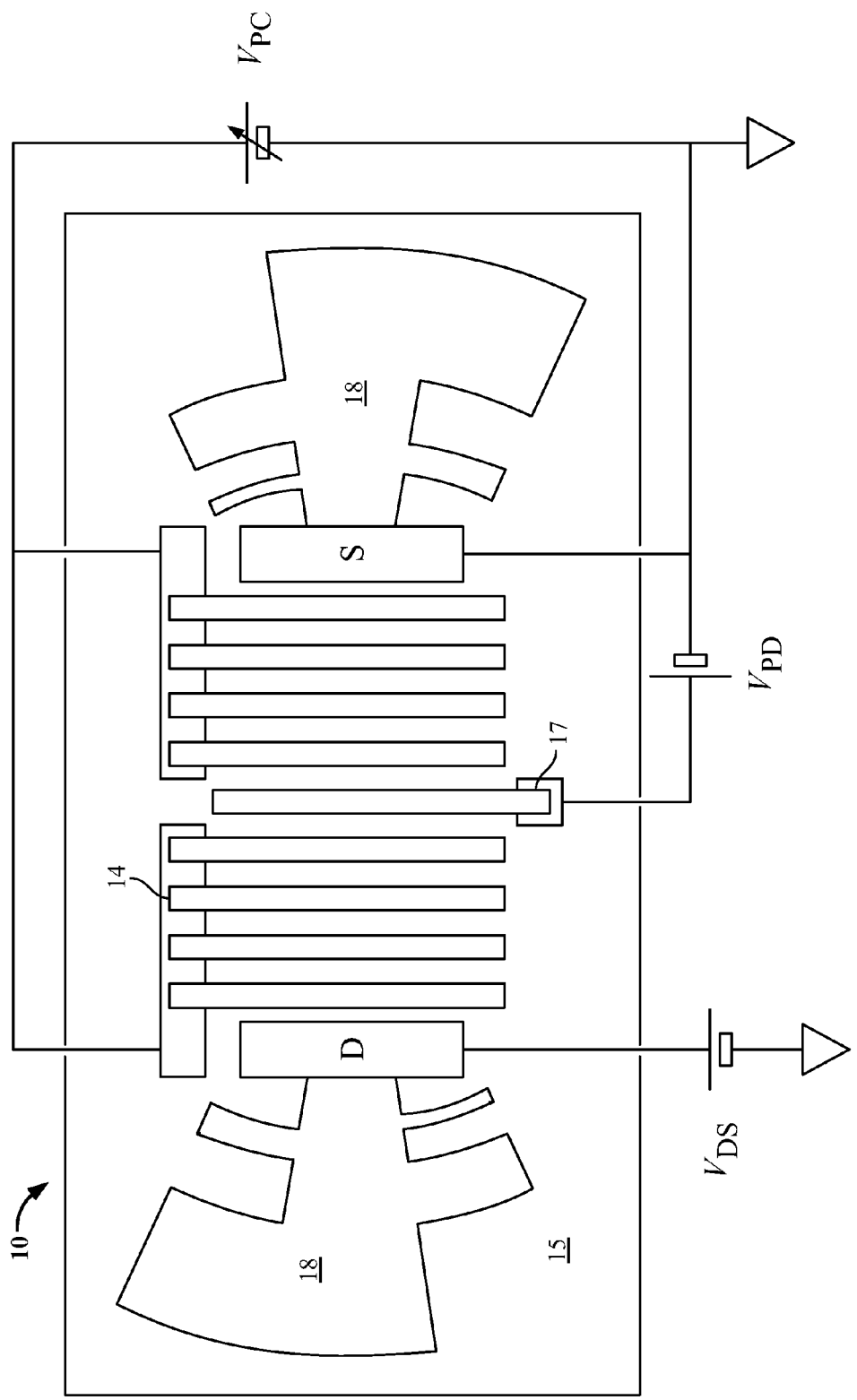

In FIG. 1(a) is shown a side-view schematic illustration of a tunable plasmonic crystal 10. The plasmonic crystal 10 comprises a layer 11 that provides a two-dimensional electron gas (2DEG) on a substrate 12. The 2DEG layer 11 comprises a gas of electrons free to move in two dimensions, but tightly confined in the third dimension. Alternatively, the plasmonic crystal can comprise a multiple layer 2DEG or a two-dimensional hole gas (2DHG). For example, the 2DEG layer 11 can comprise a semiconductor heterojunction or an atomically thin material having high electron mobility. The 2DEG mobility is preferably sufficiently large that the plasmon scattering rate is significantly smaller, preferably by at least by a factor of ten, than the 2DEG plasma frequency. The substrate preferably can form an atomically smooth 2DEG (or 2DHG) and has sufficiently low doping that the substrate bulk plasma frequency is much lower than the 2DEG plasma frequency. Therefore, the semiconductor heterojunction is preferably grown on a semi-insulating and atomically flat substrate. A periodic gate 13 comprising two or more parallel finger electrodes 14 are disposed on the 2DEG layer 11. The gate 13 can be separated from the 2DEG layer 14 by a semiconducting or insulating layer 15. The gate contacts form a Schottky barrier at the metal-semiconductor interface. The gate width and spacing from the 2DEG strongly influence the 2D plasma frequency, as will be described below. A voltage $V_{PC}$ can be applied to the periodic gate to spatially modulate the electron density in the 2DEG layer under each finger electrode 14. The voltage $V_{PC}$ can be varied to tune the charge density in the underlying 2DEG layer 11. The resulting spatially periodic plasmon structure can produce a plasmonic band structure having at least one bandgap. Electromagnetic radiation 16 at frequency υ incident on the 2DEG layer 11 can interact with the plasmonic band structure, as described below. The incident radiation 16 can have a frequency υ between about 10 GHz and 60 THz (i.e., free space wavelength of between 30 mm and 5 μm). The unit cell of the spatially periodic plasmon structure is preferably subwavelength (e.g., less than 1/10 υ) and, more preferably, deeply subwavelength (e.g., less than 1/100 υ). The precise size of the unit cell, typically on the order of several hundred nm to tens of μm, together with the 2DEG density, typically in the range of $10^{11}$ to $10^{13}$ cm$^{-2}$, determines the frequencies of the allowed bands and band gaps, as will be described more fully below. The plasmonic crystal 10 can further comprise a means (net-shown) to couple the incident electromagnetic radiation 15 into the 2DEG layer 11, such as an antenna 18 (not shown to scale) to capture an external THz signal or an on-chip THz signal generator (e.g., a local oscillator or photoconductive switch). A mesa can be defined by chemical etching and ohmic contacts to ends of the 2DEG layer 11 can be formed to provide a drain D and a source S. A response to the incident radiation 16 can be measured as a photovoltaic response $V_{DS}$ or a photoconductive response $I_{DS}$ between the drain D and the source S. In FIG. 1(b) is shown a schematic top view illustration of a tunable plasmonic crystal 10, further comprising a finger electrode 17 that can be biased at a voltage $V_{PD}$ that is different from the gate voltage $V_{PC}$, thereby providing a plasmonic defect.

The 2DEG can be formed at a heterojunction between two semiconductors having different bad gaps. The heterojunction can comprise a wide-bandgap semiconductor heavily doped with an electron donor, such as n-type AlGaAs or n-type AlGaN, and an undoped narrow bandgap semiconductor, such as GaAs or GaN. For example, the heterojunction can be fabricated using molecular beam epitaxy. The heterojunction thereby forms a quantum well in the conduction band of the undoped semiconductor. Electrons from the n-type semiconductor drop into the quantum well and can move with high mobility without colliding with impurities in the undoped semiconductor. A thin layer comprising highly mobile conducting electrons with very high concentration—the 2DEG—is thereby created at the heterojunction. Other III-V heterojunctions can also be used, including but not limited to GaAs/AlGaAs, InGaAs/InAlAs, and GaN/AlGaN.

A quantum well formed in a narrow gap semiconductor placed between wide gap semiconductors with remote n-type dopants can similarly provide a suitable 2DEG. Multiple quantum wells can also be employed, as in the exemplary devices described below, to increase the total 2DEG density through summation of the densities in adjacent wells. Choice of the type of heterojunction or quantum well can impact 2DEG mobility and density as well as the depth of the well relative to the surface or the epitaxial growth. The depth of the embedded 2DEG layer ultimately determines the strength of plasmon screening due to fabricated metal terminals. Finally, type-II heterojunctions, such as those formed between InAs/GaSb, can produce either a 2DEG or a 2DHG which will differ greatly in majority carrier effective mass.

A 2DEG can also be formed in atomically thin materials having high electron mobility, such as graphene. Graphene is a one-atom thick layer of $sp^2$-bonded carbon arranged in a regular hexagonal pattern. As such, graphene can be considered as an indefinitely large polycyclic aromatic hydrocarbon in which electrons are free to move by virtue of the $sp^2$ bonding. In particular, graphene has been found to have remarkably high electron mobility at room temperature due to the low defect scattering of intrinsic graphene. Additionally, a 2DHG having similar properties to the 2DEG but with positive carrier charge polarity can also be formed by chemical or electronic doping. Graphene is commonly procured by exfoliation or grown using chemical vapor deposition on a substrate, such as copper. Graphene flakes or sheets can be transferred to a substrate, such as silicon, silicon dioxide, silicon carbide, quartz, or boron nitride, allowing patterning by utilizing photo or electron lithography and chemical or plasma etching techniques.

As an example of the present invention, subwavelength plasmonic media that utilize a 2DEG formed at a GaAs/AlGaAs interface is described below. Exemplary devices were fabricated using standard contact lithography, metallization deposition, and lift-off techniques from a GaAs/AlGaAs double quantum well heterostructure with total 2DEG density $4.02 \times 10^{11}$ cm$^{-2}$ at 12 K. The 2DEG was embedded a distance d=386 nm below the surface of the MBE-grown heterostructure. The periodic gates were designed to have a 4.0 μm period with 50% metallization duty cycle, but the fabricated dimension differed slightly yielding a 3.8 μm period with approximately 60% metalization duty cycle of the 10 μm wide mesa. The THz radiation was generated with a microwave frequency multiplication chain and optically coupled through z-cut quartz windows in a closed cycle cryogenic system. Photoresponse and transport measurements were performed at 75 Hz modulation rate using a lock-in amplifier to measure the voltage between source and drain terminals.

Similar to the ω-q plasmon dispersion in graphene, the 2DEG plasmon dispersion depends explicitly upon both the plasmon wavevector and the AC conductivity of the medium. An effective methodology to describe plasma excitations in a 2DEG is that of an 'LC' plasmonic resonator. See P. J. Burke et al., Appl. Phys. Lett. 76, 745 (2000). Here L is the field effect tunable kinetic inductance of the 2DEG. The 2DEG capacitance can be introduced as $$C = 2 \epsilon_{eff} q \qquad (1)$$

where $\epsilon_{eff}$ is the effective permittivity of the embedded 2DEG and q is the plasmon wavevector. See G. C. Dyer et al., Phys. Rev. Lett. 109, 126803 (2012); F. Rana, IEEE Trans. on Nanotechnoloqy 7, 91 (2008); M. Staffaroni et al., Photonics and Nanostructures—Fundamentals and Applications 10, 166 (2012); and G. R. Aizin and G. C. Dyer, Phys. Rev. B 86, 235316 (2012), which are incorporated herein by reference. In high mobility 2DEG materials at microwave and THz frequencies, underdamped 'LC' plasma resonances are supported, allowing for propagation lengths on the order of tens of micrometers or plasmon wavelengths.

The introduction of spatial periodicity to a 2DEG produces a plasmonic crystal (PC) where the 2DEG is a coherent plasmonic medium. Though a PC is physically more similar to a photonic crystal than a metamaterial, the unit cell of a 2DEG PC is deeply subwavelength. These tunable plasmonic materials are conceptually related to certain periodic plasmonic nanostructures, resonant microwave metalenses, and acoustic metamaterials. See G. Shvets and Y. A. Urzhumov, Phys. Rev. Lett. 93, 243902 (2004); F. Lemoult et al., Phys. Rev. Lett. 104, 203901 (2010); and F. Lemoult et al., Phys. Rev. Lett. 107, 064301 (2011). In such systems, band structure results from incident waves interacting with spatially periodic subwavelength resonant scatterers. See Z. Liu et al., Science 289, 1734 (2000); M. Davanco et al., Opt. Express 15, 9681 (2007); and F. Lemoult et al., Nature Phys. 9, 55 (2013).

As described below, there is a complex interplay between surface states known as Tamm states, plasmonic defect (PD) modes, and the PC band structure in tunable THz plasmonic band gap devices engineered from a GaAs/AlGaAs 2DEG. See I. E. Tamm, Phys. Z. Sowietunion 1, 733 (1932). The two exemplary PC devices, Samples A and B, are shown in FIGS. 2(a) and 2(b), respectively. Both figures show images of a broadband antenna vertex of the samples with gates G1 and G2 for both samples, gate G3 for Sample B only, and source (S) and drain (D) terminals. Both samples are integrated at the vertex of the antenna having bandwidth from 100 GHz to 1 THz. Both plasmonic structures are based upon a four-period PC formed below gate G1 with an adjacent PD independently controlled by gate G2. See E. A. Shaner et al., IEEE Photonics Technol. Lett. 18, 1925 (2006); and A. R. Davoyan et al., Phys. Rev. Lett. 108, 127401 (2012). A PD is induced when G2 is tuned to a different voltage than G1. While these plasmonic band gap structures are nearly 100 times smaller than the free space wavelength of THz radiation, they cannot be considered an effective medium because the wavelengths of the THz plasmons tightly confined to the 2DEG are comparable to the size of the PC unit cell. See D. R. Smith et al., Phys. Rev. E 71, 036617 (2005); and C. R. Simovski, Metamaterials 1, 62 (2007).

It is convenient to treat the PC unit cell using this equivalent circuit approach. FIG. 2(c) shows the equivalent distributed circuit for the PC unit cell with gated and ungated region elements below G1. The adjacent regions of 2DEG in this system can be represented as sequential distributed plasmonic 'RLC' transmission line elements, as described more fully in the section below titled *Plasmonic Transmission Line Formalism and Computational Methods*. FIG. 2(d) is a cross-sectional schematic illustration of Sample A showing the coupling of fields to the plasmonic mixer induced below G2 with the depleted region shown as a dashed line and the 2DEG plasmonic crystal region below G1 indicated by a dotted line. The photovoltage $\delta V_{DS}$ is measured between the D and S terminals. The PC unit cell is indicated by a dashed box. The kinetic inductance L and resistance R of the equivalent distributed circuit are explicitly defined through the Drude conductivity of the 2DEG, $\sigma(\omega)^{-1}=R+i\omega L$, See also P. J. Burke et al., *Appl. Phys. Lett.* 76, 745 (2000); and H. Yoon et al., *Nature* 488, 65 (2012).

Tuning of the gate voltages G1 and G2 controls the 2DEG inductance and resistance, $L_j$, $R_j \propto 1/\gamma_j$. Here j defines the normalized 2DEG density in terms of the threshold voltage $V_{th}$ (where $n_{2D} \to 0$) and the applied gate voltages $V_{Gj}$ such that $\gamma_j \equiv (V_{th}-V_{Gj})/V_{th}$. In terms of the PC unit cell diagrammed in FIG. 2(c), the applied gate voltage $V_{G1}$ controls the inductance $L_1$ and resistance $R_1$. The ungated region of 2DEG has constant distributed inductance $L_0$ and resistance $R_0$.

In FIG. 2(e), the electrostatic potential Φ of a plasma wave with a frequency of ν=456 GHz is illustrated in a four-period PC formed between G2 and S. The distribution in the x-z plane of the electrostatic potential Φ is shown near the plane of the 2DEG, indicated by a dark center line. Also shown in the lower part of the figure are the spatially periodic equilibrium 2DEG kinetic inductance L and density n of the four-period PC. Here a 2 µm plasmon wavelength below G1 is evident for the 456 GHz excitation with free space wavelength of λ=658 µm, or about λ/300.

A purely electronic approach was employed to probe the plasmonic band gap structures. Depletion of the 2DEG ($n_{2D} \to 30$) below a gate allowed for a conversion of plasma waves into a measurable photoresponse that can have both photoconductive and photovoltaic contributions. See M. I. Dyakonov and M. S. Shur, *IEEE Trans. on Electron Devices* 43, 380 (1996); E. A. Shaner et al., *IEEE Photonics Technol. Lett.* 18, 1925 (2006); G. C. Dyer et al., *Appl. Phys. Lett.* 100, 083506 (2012); and V. M. Muravev and I. V. Kukushkin, *Appl. Phys. Lett.* 100, 082102 (2012). The distributed THz excitation of the device terminals produces a plasmonic homodyne mixing response measured between the drain (D) and source (S) contacts as illustrated for Sample A in FIG. 2(d). See A. Lisauskas et al., J. Appl. Phys. 105, 114511 (2009); S. Preu et al., *J. Appl. Phys.* 111, 024502 (2012); S. Preu et al., *IEEE Trans. on THz Sci. and Tech.* 2, 278 (2012); and O. A. Klimenko et al., *J. Appl. Phys.* 112, 014506 (2012). The local oscillator voltage $\delta V_{LO}$ is coupled from G2 to the region of depleted 2DEG below, while the signal coupled to the mixer is the difference between the plasmonic voltages $\delta V_D$-$\delta V_S$ generated on either side of the depletion region. A non-linear plasmonic mixing mechanism in the region of depleted 2DEG down converts the component of the differential THz signal $\delta V_D$-$\delta V_S$ in-phase with $\delta V_{LO}$ to a photovoltage ($\delta V_{DS}$).

The bulk plasmonic band structure in a PC having an infinite number of periods is first considered. The crystal dispersion of the infinite PC, plotted in FIG. 3(a) for several values of the normalized 2DEG density $\gamma_1$, was calculated from the 1D Kronig-Penney model for the unit cell shown in FIG. 1(c), $$\cos(2k_B a) = \cos(q_1 a)\cos(q_0 a) - \frac{1}{2}\left(\frac{Z_1}{Z_0} + \frac{Z_0}{Z_1}\right)\sin(q_1 a)\sin(q_0 a) \quad (2)$$

See G. R. Aizin and G. C. Dyer, *Phys. Rev. B* 86, 235316 (2012). Here $k_B$ is the Bloch wavevector, $q_j$ and $Z_j$ are the plasmon wavevector and characteristic impedance, respectively, of the two elements forming the unit cell, and a is the length of the $j^{th}$ section of 2DEG, as described below in the section titled *Plasmonic Homodyne Mixing Photoresponse*. With $\gamma_1$=0.8, minigaps begin to emerge in the 2DEG plasmon dispersion relation that is folded into the first Brillouin zone. As $\gamma_1$ further decreases, full plasmonic bandgaps are evident and the entire band structure shifts downward in frequency.

Threshold voltage $V_{th}$ of the exemplary devices was found using standard lock-in techniques to measure transistor channel conductivity. A fit of the conductivity near threshold was extrapolated to determine $V_{th}$=−2.67 V for Sample A and $V_{th}$=−2.73 V for Sample B. Photoresponse measurements were performed with $V_{G2}$=−2.80 V for Sample A and $V_{G3}$=−2.80 V for Sample B. Samples A and B were characterized independently and aligned to the THz source using a raster scan to locate the maximum photovoltage signal at a given excitation frequency. All measurements were performed at T=8 K.

A four-period PC between S and G2 can be induced in Sample A, shown in FIG. 2(a), by biasing the defect gate G2 past its threshold voltage as illustrated in FIG. 2(d). The PC formed below G1 delivers a plasmonic signal to a rectifying detection element under G2, generating a photovoltage $\langle \delta V_{DS} \rangle$ (see section below titled *Plasmonic Homodyne Mixing Photoresponse*). By tuning $V_G$, and frequency ν as plotted in FIG. 3(b), the measured photoresponse maps the plasmonic spectrum of Sample A. The light regions correspond to the resonant excitation of plasma modes in the system. The resonant modes calculated for the four-period PC using the transfer matrix formalism, shown by solid lines, agree well with experiment. See G. C. Dyer et al., *Phys. Rev. Lett.* 109, 126803 (2012); and G. R. Aizin and G. C. Dyer, *Phys. Rev. B* 86, 235316 (2012). Where the calculated resonances become extremely dense (ν above 350 GHz and $V_{G1}$<−2.00 V), the experimental modes also cannot be resolved due to broadening of the resonances.

Each unit cell of the four-period structure would have an identical resonant frequency in isolation. However, the coherence of the plasma wave across the PC lifts this four-fold degeneracy, resulting in the formation of four state bands. Alternately, this can be considered a Fano-type system where interference between a continuum, the allowed bands of the PC, and the discrete modes of the cavity formed between S and G2 produces groups of four asymmetric resonances. See M. Davanco et al., *Opt. Express* 15, 9681 (2007). These bands of states are demonstrated in FIG. 3(a) to tune a minimum of 50% in frequency from 300 GHz to 450 GHz, though in principle the shift of the band gap can be well in excess of 100%.

The first three experimentally observed resonances M1, M2, and M3 in FIG. 3(b) moving from the lower right-hand corner (300 GHz and $V_{G1}$=0.00 V) towards the upper left-hand corner are positioned in an allowed infinite PC band. These bands are shown as dark lines. However, the fourth mode M4 associated with this band is largely found in the second band gap of the infinite PC, where it is shown as a light line. The same conclusion holds true for higher plasmonic bands. All regions of these modes shown as light lines are in the predicted band gaps corresponding to those labeled in FIG. 3(a), including a pair near $V_{G1}=-1.80$ V and 300 GHz. These modes can potentially represent plasmonic Tamm states. See G. R. Aizin and G. C. Dyer, *Phys. Rev. B* 86, 235316 (2012); and I. E. Tamm, *Phys. Z. Sowietunion* 1, 733 (1932). Tamm states, weakly localized crystal surface states with a complex rather than purely real Bloch wavevector Im[$k_B$d]≠0, are generally found in a band gap and have been experimentally demonstrated previously only in a few electronic, optical, and hybrid optical-plasmonic systems. See H. Ohno et al., *Phys. Rev. Lett.* 64, 2555 (1990); T. Goto et al., *Phys. Rev. Lett.* 101, 113902 (2008); and O. Gazzano et al., *Phys. Rev. Lett.* 107, 247402 (2011). In contrast to surface states resulting from dislocations and impurities, Tamm states form at the ideal termination of a lattice and are most easily isolated in tailorable structures like semiconductor superlattices and photonic crystals.

To confirm the presence of Tamm states in this system, Sample B, pictured in FIG. 2(b), was studied with gate G3 biased beyond its threshold voltage. Here the last stripe of depleted 2DEG below G3 operates as a rectifying detector, as illustrated in FIG. 4(a). The plasmonic detection region is indicated by dashes under G3. This configuration of Sample B provides a means to study the strong coupling between the four-period PC below G1 and a PD, defined under G2. See E. A. Shaner et al., *IEEE Photonics Technol. Lett.* 18, 1925 (2006); A. R. Davoyan et al., *Phys. Rev. Lett.* 108, 127401 (2012); and V. M. Muravev et al., *Appl. Phys. Lett.* 100, 082102 (2012). The photoresponse to excitation frequencies of 302.5, 363.0 and 420.5 GHz as G1 and G2 are independently tuned is shown in FIGS. 4(b), 4(d) and 4(f), respectively. As in FIG. 3(b), the light regions represent plasma resonances. In FIGS. 4(c), 4(e) and 4(g) the calculated PC-PD structure plasmon modes are plotted as solid lines for these same frequencies as a function of normalized 2DEG densities $\gamma_j$ corresponding to the experimentally applied gate voltages. The band gaps of the infinite PC where the Bloch wavevector of experimentally observed resonances has a non-zero imaginary component are indicated as vertical shaded regions.

An understanding of the relationship between the PC and PD states emerges when considering FIGS. 4(b)-4(g) together. The four period PC modes are tuned by G1 and appear as vertical features when the PD is not resonating. PD resonances are modes controlled by G2 and appear as light horizontal lines where sequential anticrossings occur. When $V_{G1}=V_{G2}$, the PD may be viewed as a fifth identical unit cell that is appended to the four-period PC under G1. This condition is satisfied along the diagonal lines in FIGS. 4(b)-4(g) where a fifth discrete mode is added to each band by a higher order mode moving into a lower energy band after traversing the infinite PC band gap. The boxes in FIGS. 4(b)-4(e) highlight repelled crossings between Tamm and PD states in or near the second band gap along the diagonal line $V_{G1}=V_{G2}$. A repelled crossing is found along this diagonal if and only if a PD and a Tamm state of the same order are mutually coupled. Because an isolated PD state is localized, it must enter into a band gap before joining a five-state band as an orthogonal PC mode. Only localized states are found in the infinite PC band gap.

A Tamm state localized at the Ohmic contact is the only viable candidate to cross with a PD mode along the line $V_{G1}=V_{G2}$.

There are several additional distinctions between crossings of the PD modes with purely real-valued Bloch wavevector PC states and with complex Bloch wavevector Tamm states. Modes in the allowed bands are completely delocalized and therefore are widely separated as they come into resonance with a PD mode. In FIGS. 4(f) and 4(g) under 420.5 GHz excitation where the band gaps largely vanish, none of the PC states becomes localized and for any fixed choice of $V_{G1}$ (i.e., $\gamma_1$) the resonances are widely spaced in $V_{G2}$ ($\gamma_2$). In contrast, due to the localization of Tamm states, both their coupling with the PD and the size of the PD-Tamm splitting are comparatively smaller. This leads to the close approach of the modes in the boxed regions of FIGS. 3(b)-3(e).

As the energy of a PD mode approaches that of the Tamm state by tuning $V_{G2}$-$V_{G1}$, both modes may be interpreted as Tamm states. The observed splitting results from the interaction of states bound to opposing ends of the PC. One Tamm state is weakly localized at the Ohmic contact. When the PD state energy matches that of the Tamm state, a second Tamm state forms adjacent to the detection element. A phenomenon analogous to electromagnetically induced transparency (EIT) develops under these conditions because of the mutual coupling and asymmetric excitation of these two weakly localized modes. See N. Liu et al., *Nature Mater.* 8, 758 (2009); P. Tassin et al., *Phys. Rev. Lett.* 102, 053901 (2009); R. D. Kekatpure et al., *Phys. Rev. Lett.* 104, 243902 (2010); and B. Luk'yanchuk et al., *Nature Mater.* 9, 707 (2010).

Several conditions must be satisfied for the coupling of the PD to the Tamm state at the Ohmic contact to be considered an EIT phenomenon. See P. Tassin et al., *Phys. Rev. Lett.* 109, 187401 (2012). The description of EIT in classical systems is that of two coupled oscillators, one of which is 'bright' and the other 'dark' with respect to incident radiation. In this picture, the PD and Tamm states then must be coherently coupled and resonate at the same frequency, conditions that are satisfied empirically in this plasmonic system. More importantly, there must be an asymmetry in both the external coupling and the damping rates of the coupled plasmonic oscillators. The 'dark' resonance must be weakly externally coupled and have a higher quality factor than the 'bright' resonance. In high quality 2DEG plasmonic systems, weak coupling to an external excitation implies a higher 'Q' resonance because radiative damping is the dominant dissipation mechanism of the plasmon (see section below titled *Plasmon Damping and Experimental Coherence Limits*).

Figure 5A:
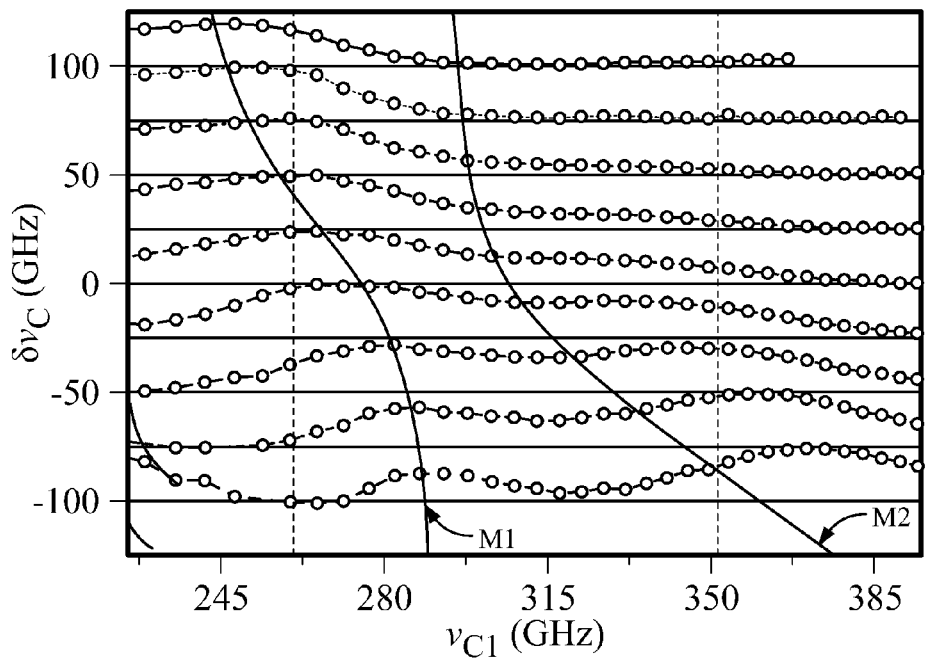
FIG. 5($a$) is a graph of the normalized photovoltage as a function of the PC characteristic frequency for a 210.0 GHz excitation. Each curve corresponds to a different detuning of the PD characteristic frequency relative to that of the PC unit cell from −100 to +100 GHz in 25 GHz steps. The calculated modes M are plotted as solid lines with band gaps shown as vertical shaded regions. The arrows highlight modes denoted M1 and M2.

This plasmonic EIT-like effect can be studied through analysis of the PC-PD modes in and near the first band gap. While it is common to sweep frequency in order to map the interaction of strongly coupled resonators, an approach of tuning resonators in-situ with fixed excitation frequency yields the same information. See B. Luk'yanchuk et al., *Nature Mater.* 9, 707 (2010). FIG. 5 illustrates induced transparency in the first plasmonic band gap. In FIG. 5(a) the photoresponse of Sample B with an excitation frequency of 210.0 GHz is shown. Here the characteristic frequency $v_{C1}$ of the PC unit cell is swept for different detunings $\delta v_C$ of the PD relative to PC unit cell. Each curve corresponds to a different detuning of the PD characteristic frequency relative to that of the PC unit cell from −100 to +100 GHz in 25 GHz steps. The characteristic plasma frequencies $$v_{Cj} = \beta_C / 2\pi\sqrt{L_j C_j} \qquad (3)$$

are defined for the PC unit cell (j=1) and PD (j=2) using the fundamental wavevector $\beta_C=\pi/a$ of the plasmon mode confined below an a=2 μm wide gate finger. In fact, the characteristic frequencies $v_{Cj}$ are the fundamental plasma frequencies of the isolated PC unit cell and PD. The detuning of the PD characteristic frequency from that of the PC unit cell is given by $\delta v_C = v_{C2} - v_{C1}$. These definitions of $v_{Cj}$ parameterize the strong coupling behavior of the PC-PD system.

For positive detunings $\delta v_C > 50$ GHz, an asymmetric resonance associated with the PD is observed at the edge of the band gap (shown as a vertical shaded region in FIG. 5(a)), while the Tamm state appears inert due to its poor coupling to both the incident THz field and the integrated detector. The PD is interpreted as a 'bright' resonator that under appropriate conditions can couple to and drive the 'dark' Tamm state. The PD and Tamm states become strongly interacting when the detuning is reduced, $-50$ GHz $\leq \delta v_C \leq +50$ GHz. As the energetic difference between these states decreases, the 'bright' PD excites the formerly 'dark' Tamm state. A characteristic signature of EIT, a symmetric double peak with a dip at its center, is evident with the detuning set to $\delta v_C = -50$ GHz. For negative detunings $\delta v_C < -50$ GHz, the PD state shifts to larger characteristic frequencies $v_{C1}$ and the Tamm state's amplitude decreases. The calculated modes shown in FIG. 5(a), agree well with the measurements.

Figure 4:
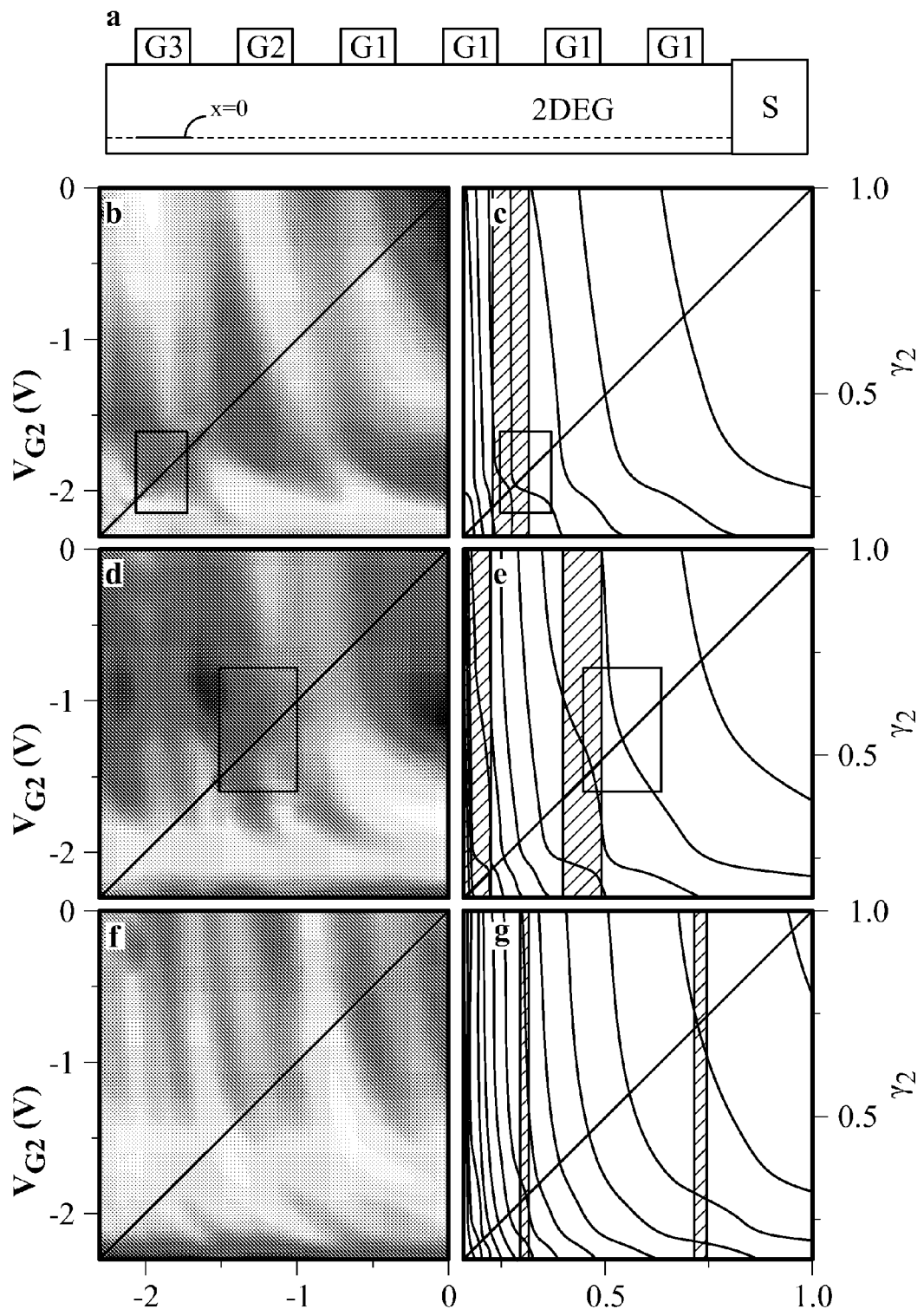
FIG. 4($a$) is a schematic illustration of Sample B configured such that a four period PC, tuned by G1, with adjacent PD, tuned by G2, is formed between S and G3. The plasmonic detection region is indicated by dashes.
Figure 5B:
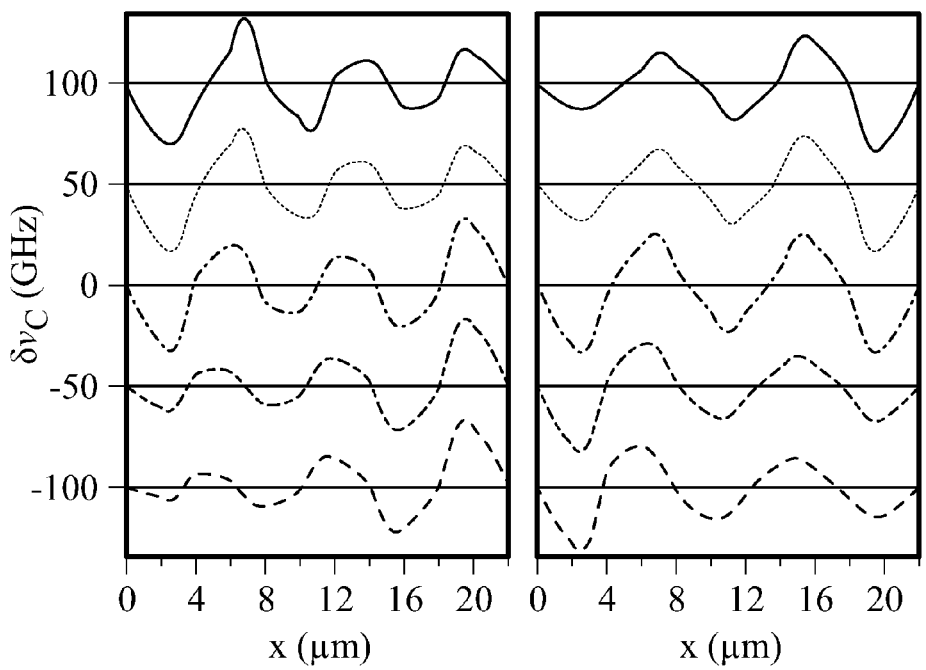

The plasmonic spatial distributions in FIG. 5(b) highlight the evolution of the PD and Tamm states under 210.0 GHz excitation. The spatial voltage distributions in the plane of the 2DEG for modes M1 and M2, indicated by the arrows linking to FIG. 5(a), are plotted for several detunings $\delta v_C$. The position corresponds directly to FIG. 4(a); the mixer edge is at x=0 μm, the PD is located between 2 μm≤x≤4 μm, and the PC is found between 6 μm≤x≤22 μm. Both the 'bright' PD state, seen distinctly with $\delta v_C > 0$ for M1 and $\delta v_C < 0$ for M2, and the 'dark' Tamm state, observed with $\delta v_C < 0$ for M1 and $\delta v_C > 0$ for M2, are weakly localized. For $\delta v_C = 0$, the crystal is sufficiently short that the spatial overlap of the two weakly localized states lifts their degeneracy. PC modes develop around zero detuning that are analogous to bonding and anti-bonding states and may also be interpreted as coupled Tamm states.

Induced transparency can take on multiple connotations in this context. In a literal sense, the PD-Tamm state coupling allows for the plasmon mode trapped near the Ohmic contact to couple to the opposing edge of the PC. The Tamm state in the opaque band gap then is observable by the integrated detector. However, the more rigorous definition of EIT is also satisfied due to the coherent coupling of PD and Tamm states and the inherent asymmetries of the PC-PD structure.

The following sections describe the computational approach and the theory of plasmonic crystals formed from a 2DEG, how a DC response results from a homodyne mixing mechanism by comparison of photoresponse and transport data, calculations of the plasmon Q factor and propagation length and comparison of these results to measurements of the plasmonic spectrum in four and eight period plasmonic crystal samples, and the scalability of the plasmonic crystal through the predicted band structure of GaAs/AlGaAs and GaN/AlGaN devices.

Plasmonic Transmission Line Formalism and Computational Methods

A generalized transmission line (TL) theory was used to describe the plasmonic states in a periodically modulated 2DEG. In this approach, an electron plasma wave propagating in the 2D channel is described in terms of the equivalent TL with distributed R, L, and C circuit elements as shown in FIG. 1(c). See G. C. Dyer et al., *Phys. Rev. Lett.* 109, 126803 (2012); and G. R. Aizin and G. C. Dyer, *Phys. Rev. B* 86, 235316 (2012), which are incorporated herein by reference. The intrinsic resistance R and kinetic inductance L of the 2D channel is based on the Drude conductivity of the 2DEG. The intrinsic 2DEG kinetic inductance is $L = m^*/e^2 n_{2D}$, where e is the electron charge, $n_{2D}$ is the intrinsic density of the 2DEG, and m* is the electron effective mass. The intrinsic 2DEG resistance subsequently can be expressed as $R = L/\tau$, where τ is the plasmon damping time. Equivalent circuit capacitance per unit area can be defined as $C = \rho_{q\omega}/\phi_{q\omega}$ where $\rho_{q\omega}$ and $\phi_{q\omega}$ are fluctuations of electron density and electric potential, respectively, in the plasma wave with frequency ω and wave vector q. Solving the electrostatic equations in the quasi-static approximation gives:

$$C = \varepsilon q(1 + \coth qd), \quad (4)$$

where d is the gate-channel separation and ε is the permittivity of GaAs. See G. C. Dyer et al., *Phys. Rev. Lett.* 109, 126803 (2012). This is an explicit expression equivalent to Eq. (1) specific to a screened 2DEG system. With these definitions of the distributed circuit elements, the plasmon dispersion relation can be expressed through the standard TL formulas. See C. Paul, *Analysis of Multiconductor Transmission Lines* (2007). In the high mobility 2DEG samples with large quality factor, $Q \cong \omega L/R \gg 1$, plasmon damping can be neglected, and the plasmon dispersion law written in terms of the TL model is $$q = \omega \sqrt{LC}. \quad (5)$$

The last equation is equivalent to the well-known plasmon dispersion formula $$\omega = \sqrt[4]{e^2 n_0 q / m^* \varepsilon (1 + \coth qd)}.$$

See T. Ando et al., *Rev. of Mod. Phys.* 54, 437 (1982). To complete the TL description of the 2DEG, its characteristic impedance can be introduced as $$Z(\omega) = \frac{1}{w\xi(\omega, d)} \sqrt{\frac{L}{C}} = \frac{1}{w\xi(\omega, d)\varepsilon\omega(1 + \coth qd)}, \quad (6)$$

where w=10 μm is the width of the 2D channel, and the form-factor $\xi(\omega, d)$ is defined as $$\xi(\omega, d) = \frac{1}{2} - \frac{qde^{-2qd}}{1 - e^{-2qd}}. \quad (7)$$

See G. C. Dyer et al., *Phys. Rev. Lett.* 109, 126803 (2012). In Eqs. (6) and (7) the wave vector q at given frequency ω is determined by the dispersion equation, Eq. (5). Definition of the characteristic impedance in Eq. (6) differs from the standard TL definition by an additional form-factor $\xi(\omega, d)$. See C. Paul, *Analysis of Multiconductor Transmission Lines* (2007). This form-factor accounts for the contribution of the longitudinal component of the plasmon electric field into the electric power carried by the plasma wave. See F. Rana, *IEEE Trans. on Nanotechnology* 7, 91 (2008). With characteristic impedance defined in Eq. (6) an average electric power P carried by the plasmon propagating in the x-direction in the 2D channel positioned at z=0 is determined as $$P(x) = \frac{1}{2} I^*(x) V(x). \tag{8}$$

Here V(x) is an electric potential in the 2D channel, and I(x)=V(x)/Z is an effective plasmonic current in the 2D channel which includes both conduction current and displacement current induced by the longitudinal electric field of the plasmon. See G. C. Dyer et al., *Phys. Rev. Lett.* 109, 126803 (2012); and G. R. Aizin and G. C. Dyer, *Phys. Rev. B* 86, 235316 (2012). Eqs. (4) to (8) provide a foundation for treating plasmon propagation in the 2DEG as a TL problem described by the standard transfer matrix formalism for a two-port network. See C. Paul, *Analysis of Multiconductor Transmission Lines* (2007).

The 2D electron channel in the periodically gated samples A and B can be considered as a segmented TL with individual segments corresponding to the gated or ungated 2DEG regions. The transfer matrix for the $j^{th}$ plasmonic TL segment of length a is given by $$t_j = \begin{pmatrix} \cos q_j a & iZ_i \sin q_j a \\ iZ_j^{-1} \sin q_j a & \cos q_j a \end{pmatrix} \tag{9}$$

and connects electric potentials and effective currents on the left and the right edges of the $j^{th}$ TL segment. See G. R. Aizin and G. C. Dyer, *Phys. Rev. B* 86, 235316 (2012). To find plasmon frequencies for the samples, a composite transfer matrix for the periodically gated 2DEG can be calculated by multiplying sequentially the matrices $t_j$. For Sample A, the TL consists of alternating four gated (j=1) and five ungated (j=0) segments. It is terminated by the source S on one side and by the pinched off gate G2 on the other side as illustrated in FIG. 2(d). For Sample B, the TL consists of alternating four gated (j=1) and five ungated (j=0) segments followed by the defect segment (j=2) and final ungated segment (j=0). It is terminated by the source S on one side and the pinched off gate G3 on the other side as illustrated in FIG. 4(a). All segments have length=2 μm.

The composite 2×2 transfer matrix $$T(\omega) = \begin{pmatrix} T_{11}(\omega) & T_{12}(\omega) \\ T_{21}(\omega) & T_{22}(\omega) \end{pmatrix} \tag{10}$$

can be used to find the plasmon eigenfrequencies of the segmented plasmonic TL system if appropriate boundary conditions are imposed at the termination points. The Ohmic source contact is assumed to function as an RF short. The measured photovoltage resonances correspond to the minima of the input TL impedance at the mixer side termination. In a model with negligible plasmon damping, this corresponds to the short circuit boundary condition. With short circuit boundary conditions at both ends of the TL the frequencies of the plasmon eigenmodes are determined by the equation $$T_{12}(\omega)=0. \tag{11}$$

See G. R. Aizin and G. C. Dyer, *Phys. Rev. B* 86, 235316 (2012). Numerical solutions of this equation for Samples A and B are plotted in FIG. 3(b), FIGS. 4(c), 4(e) and 4(g), FIG. 5(a), respectively. For a given plasma mode the voltage distribution V(x) in any segment can be found numerically in a straightforward way by replacing constant a in the transfer matrix in Eq. (9) with a variable position x and successively applying incremental steps in position x. This method was used to find voltage distributions of eigenstates states plotted in FIG. 2(e) and FIG. 5(b).

The transfer matrix formalism was also used to find the plasmonic band spectrum of the infinite PC with lattice constant 2a and a bipartite unit cell consisting of the ungated (j=0) and gated (j=1) segments of equal length. This PC is described by the standard 1D Kronig-Penney model with dispersion determined by the equation $$\cos 2k_B a = \cos q_0 a \cos q_1 a - \frac{1}{2}\left(\frac{Z_0}{Z_1} + \frac{Z_1}{Z_0}\right) \sin q_0 a \sin q_1 a, \tag{12}$$

where $k_B \in [-\pi/2a, \pi/2a]$ is the Bloch wave vector. See V. Y. Kachorovskii and M. S. Shur, *Appl. Phys. Lett.* 100, 232108 (2012); and G. R. Aizin and G. C. Dyer, *Phys. Rev. B* 86, 235316 (2012). The plasmonic band gaps found numerically from this equation at different density modulations were used to plot the PC dispersion and identify potential plasmonic Tamm states in FIGS. 3(a) and 3(b), respectively. These gaps are also indicated in FIGS. 4 and 5.

For the numerical results shown, the approximation that both ungated and gated 2DEG regions were screened identically by the gate metallization d=400 nm above the 2DEG was used. Thus, the step-like spatial modulation of the system was primarily imposed by the differences in the carrier density. No assumptions were made with regards to how the distributed excitation is coupled to the PC-defect system. The calculations were performed using a code as follows. First, Eq. (5) was solved numerically at each value of the density modulation and frequency ω to find the wave vector q. Then these results were used to find numerical solutions of Eq. (11) and to find the plasmonic band gaps from Eq. (12). By using the equivalent TL transfer matrix method rather than a full FDTD approach, dense mappings of the phase space can be computed rapidly on a standard laptop computer. The trade-off is a lack of precise knowledge of the field distribution surrounding the device at the antenna vertex.

Plasmonic Homodyne Mixing Photoresponse

Figure 6A:
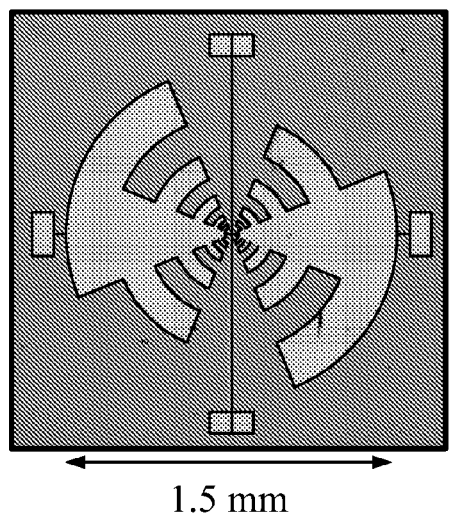
FIG. 6(a) is an image of the broadband antenna of Sample B.
Figure 6B:
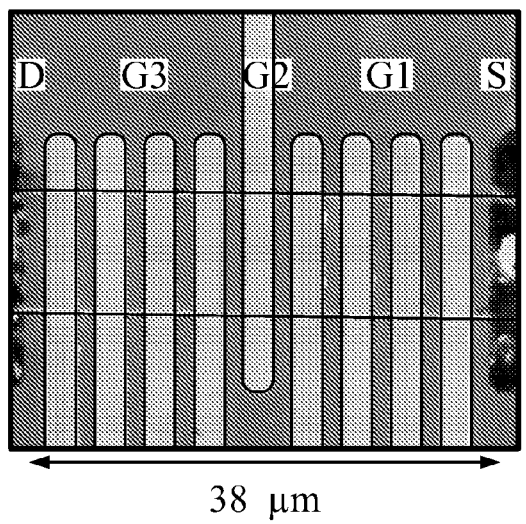
FIG. 6(b) is a SEM micrograph of Sample B with gate, source and drain terminals labeled G1, G2, G3, S and D, respectively.

The plasmonic crystal structure can be characterized using a detector-like geometry. The antenna-PC structure shown in FIGS. 6(a) and 6(b) constitutes a passive but reconfigurable integrated THz photonic circuit with three fundamental components: terahertz voltage generators, plasmonic waveguides, and plasmonic mixers. The broadband log-periodic antenna in FIG. 6(a) couples THz radiation quasi-optically from a microwave frequency multiplier to the plasmonic circuit. The antenna functions as the voltage generator of the circuit by providing a distributed excitation of the device at its vertex. Due to the modest capacitive reactances (typical capacitances on the order of 1 fF corresponds to a 318 Ohm reactance at 500 GHz) between devices terminals, no special techniques are required to couple to the gate terminals. The phase of the excitation field can be considered as nearly constant across the PC and mixing elements, though no assumptions are made concerning the amplitude of the field. The regions of 2DEG below and between the gate metallization function as waveguides delivering a signal to the mixer. The plasmonic mixer is induced when the 2DEG below a gate (or multiple gate fingers) is depleted, $n_{2D} \to 0$. The non-linearity of the transport in this region allows for THz plasmonic mixing. Additionally, as $n_{2D} \to 0$ the plasmon wavevector becomes infinite, q→∞, and the mixer also has an infinite electrical length. The regions of 2DEG on opposing sides of the mixer are consequently decoupled.

The measured homodyne mixing photovoltage tracks the transport as $$\langle \delta V_{DS} \rangle = -G_{DS} \frac{\partial R_{DS}}{\partial V_{G2}} \langle \delta V_{LO}(t)[\delta V_D(t) - \delta V_S(t)] \rangle \tag{13}$$

where the time dependent quantities are the LO and signal voltages illustrated FIG. 2(d) and $$G_{DS} \frac{\partial R_{DS}}{\partial V_{G2}}$$

is found from DC transport measurements sweeping G2. See S. Preu et al., *J. Appl. Phys.* 111, 024502 (2012). Implicit in Eq. (13), which describes a small-signal mixing response, is a differential signal input from source and drain-side plasmonic waveguides. The mixing response then is proportional to the in-phase component of the differential signal $\delta V_D(t) - \delta V_S(t)$. The quadrature component of the differential signal $\delta V_D(t) - \delta V_S(t)$ cannot be measured due to the 90 degree phase difference between the LO voltage $\delta V_{LO}(t)$ and the out-of-phase components of $\delta V_S(t)$ and $\delta V_D(t)$. Qualitatively, the 2DEG below gate G2 at its threshold voltage is driven at THz frequencies from conductive to highly resistive as a THz voltage is simultaneously applied laterally across this region. See A. Lisauskas, *J. Appl. Phys.* 105, 114511 (2009). This produces a rectified signal as a result of plasmonic homodyne mixing.

Figure 6C:
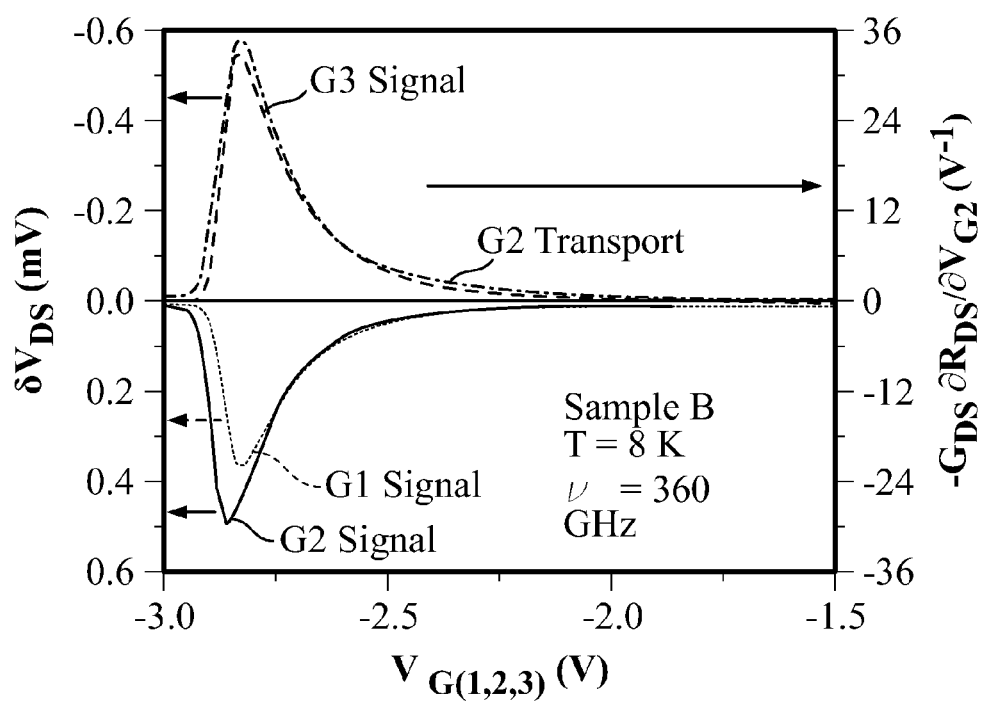
FIG. 6(c) is a graph of the plasmonic mixing response of Sample B for all three gates G1, G2, and G3 as a function of gate voltage and compared to the transport characteristic correlated with this mechanism as denoted in Eq. (4).
Figure 7:
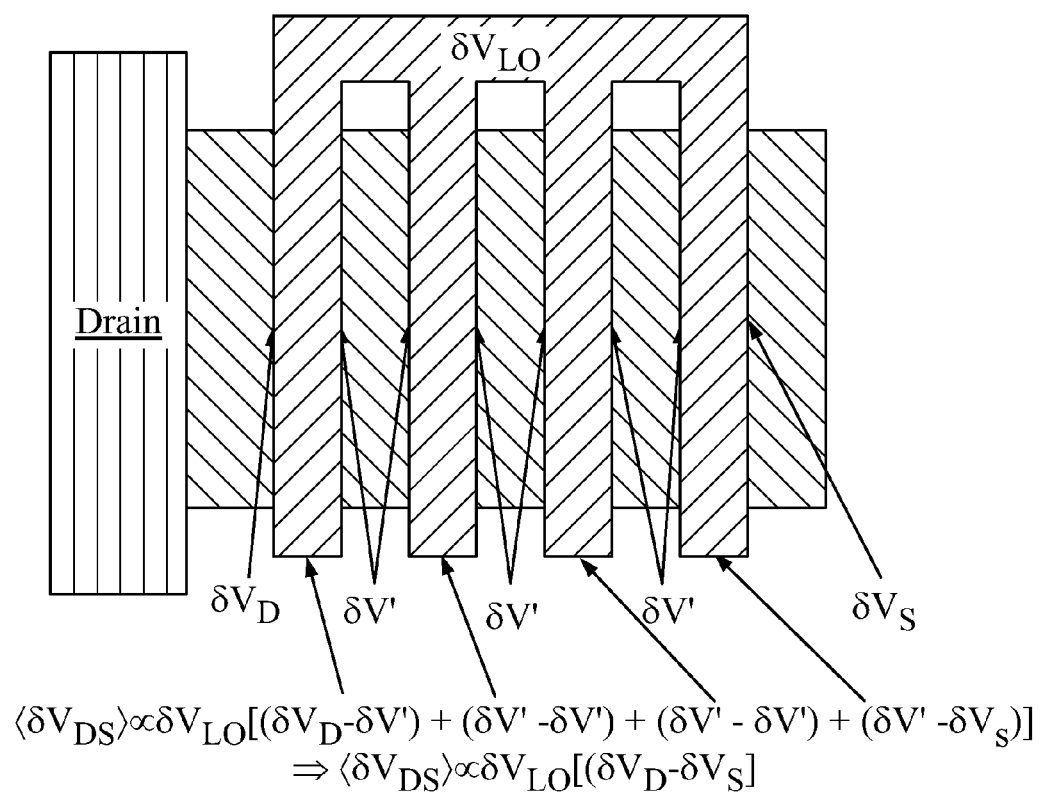
FIG. 7 is a schematic illustration of Sample B with G3 at threshold, showing that the four induced plasmonic mixing elements produce a mixing response as if there were only a single mixing element induced.

Study of the photovoltage by sweeping-gates G1, G2 and G3 of Sample B (see FIG. 2(b)) validates the assertion that the measured response is a homodyne plasmonic mixing signal. This is shown in FIG. 6(c) where Sample B is illuminated with 360 GHz radiation at 8 K and one gate is swept while the other two are held at ground potential. The photovoltaic response was measured using a lock-in amplifier (LIA) with 75 Hz modulation of the incident radiation. The amplitude of the homodyne mixing signal produced by all three gates follows the transport curve for gate G2 as in Eq. (13). This indicates that each finger of gates G1 and G3 acts as a discrete mixer since the response tracks the non-linearity of the single-finger gate G2 transport. This is illustrated schematically in FIG. 7 for gate G3 biased to its threshold voltage, showing that the four induced plasmonic mixing elements produce a mixing response as if there were only a single mixing element induced. To produce a net rectified signal, an asymmetry in the voltage signals delivered to the mixing elements is required. See V. V. Popov et al., *Appl. Phys. Lett.* 99, 243504 (2011). Due to the symmetry of the excitation and 2DEG between depleted regions, the four finger gate in fact behaves nearly identically to a single finger in terms of its homodyne mixing response. The symmetry of the identical 2DEG regions and excitation in the three regions of 2DEG between the gate fingers leads to no net photovoltage. Only the 2DEG at the far left and right edges of gate G3 can have an asymmetry that yields a non-zero plasmonic mixing photovoltage.

The polarity of the signal reverses when G1 and G3 are exchanged as the gates are held at threshold bias. See V. M. Muravev and I. V. Kukushkin, *Appl. Phys. Lett.* 100, 082102 (2012). This demonstrates the differential nature of the mixing signal because source and drain side waveguides have their roles exchanged. With G1 biased to its threshold voltage, the 2DEG below G2 and G3 is excited and produces a net positive photovoltage since $\delta V_D(t) > \delta V_S(t)$. With G3 biased to its threshold voltage, the 2DEG below G1 and G2 is excited and produces a net negative photovoltage since $\delta V_D(t) < \delta V_S(t)$. Due to either a built-in device asymmetry or a misalignment of the incident THz beam, there is a non-zero photovoltage produced with G2 at threshold and G1 and G3 at ground.

The relative maxima of the negative polarity photovoltage $\langle V_{DS}(V_G, \nu) \rangle$ can be interpreted as resonances. Because the PC structure is formed on the source-side of the mixer in both Samples A and Sample B, the contribution $\delta V_S(t)$ to the measured photovoltage is negative in polarity. From the perspective of a multi-port network, the absolute minima in response then correspond to maxima in the real part of the input impedance of the PC structure as seen from the port adjacent to the plasmonic mixer. Conversely, relative maxima in $\langle \delta V_{DD}(V_G, \nu) \rangle$ then are minima in the real part of the input impedance as seen from the plasmonic mixer.

Because the radiation resistance of the antenna is approximately 72 Ohms, for these exemplary device geometries minima in their input impedance produce optimal impedance matching and thus optimal power coupling to the plasmonic circuit. The resonances as defined should thus be viewed as peaks in power coupling or transmission across the structure. This is also consistent with the interpretation of the observed defect-Tamm state splitting as electromagnetically induced transparency. It follows that the self-normalization of the response at fixed measurement frequencies $\nu = \nu_{meas}$ is given by $$\langle \delta V_{DS}(V_G) \rangle_{norm} = \frac{\langle \delta V_{DS}(V_G) \rangle - \text{Min}[\langle \delta V_{DS}(V_G) \rangle]}{\text{Max}[\langle \delta V_{DS}(V_G) \rangle] - \text{Min}[\langle \delta V_{DS}(V_G) \rangle]} \tag{14}$$

Plasmon Damping and Experimental Coherence Limits

The TL model described above can be adapted to include plasmon damping by accounting for dissipation in the definitions of the transmission line characteristic impedance and dispersion. For calculating the plasmon Q-factor and propagation lengths, it is sufficient to define the dispersion law as $$q = -i\sqrt{i\omega C(i\omega L + R)} \tag{15}$$

where R accounts for the damping of the plasma wave. This resistance includes not only the scattering rate found from the Drude conductivity of the 2DEG, but also a radiative damping contribution. For high mobility 2DEGs ($\mu_{mob} > 100{,}000$ cm²/Vs), this radiation resistance is a more significant damping mechanism than the intrinsic 2DEG resistance. See S. A. Mikhailov, *Phys. Rev. B* 54, 10335 (1996). The total resistance can be defined in terms of the mobility and radiative scattering rates as, $$R = \frac{m^*}{\omega e^2 n_{2D}} (\tau_{mob}^{-1} + \tau_{rad}^{-1}) \tag{16}$$

where $$\tau_{mob}^{-1} = \frac{e}{m^* \mu_{mob}} \quad (17)$$

and $$\tau_{rad}^{-1} = \sqrt{\frac{\mu_0}{\varepsilon}} \frac{e^2 n_{2D}}{2m^*}. \quad (18)$$

Using only fundamental constants and known or measured quantities (2DEG density, mobility, GaAs permittivity, carrier effective mass), the resistance in Eq. (16) can be calculated explicitly to estimate the effects of dissipation upon the plasma wave.

To determine the plasmon Q-factor and propagation length from Eq. (15), it is convenient to rewrite the dispersion law as $$q = \beta + i\alpha. \quad (19)$$

Then the Q-factor can be defined as, $$Q = \frac{\beta}{2\alpha} \quad (20)$$

with the propagation length of the damped plasmon subsequently given by, $$L_p = \frac{Q}{\beta} = \frac{1}{2\alpha}. \quad (21)$$

Both the Q-factor and propagation length relate to power dissipation of the plasmon. For examining coherent coupling effects, it is the coherence length that provides the more salient figure of merit. The coherence length is twice the propagation length, $$L_C = \frac{1}{\alpha}. \quad (22)$$

Figure 8B:
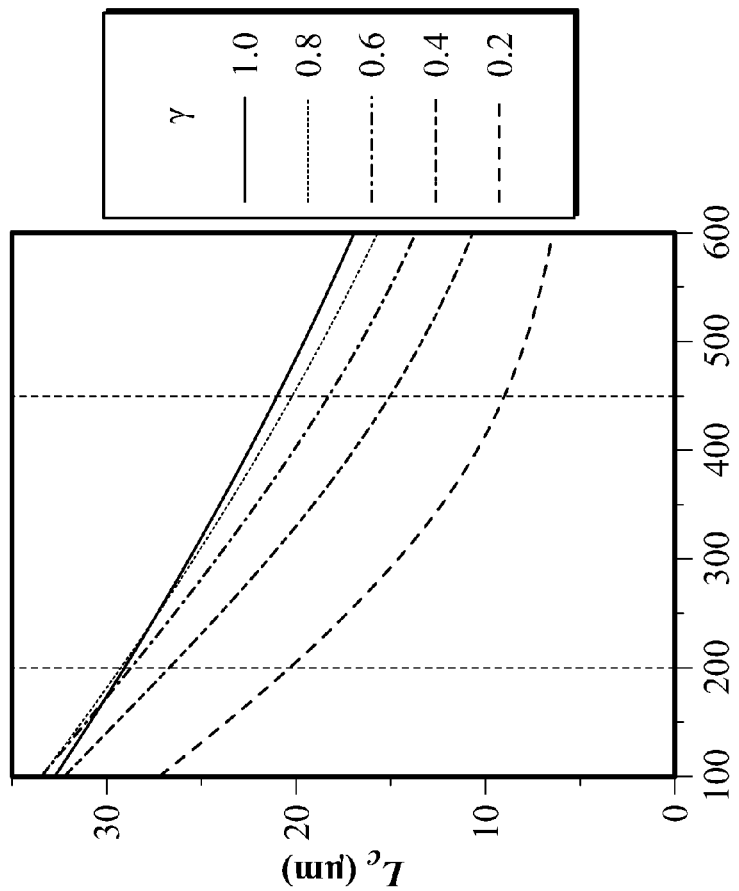
FIG. 8(b) is a graph of the coherence length. The area between the vertical dashed lines indicates the frequency range where photoresponse measurements were performed.
Figure 8A:
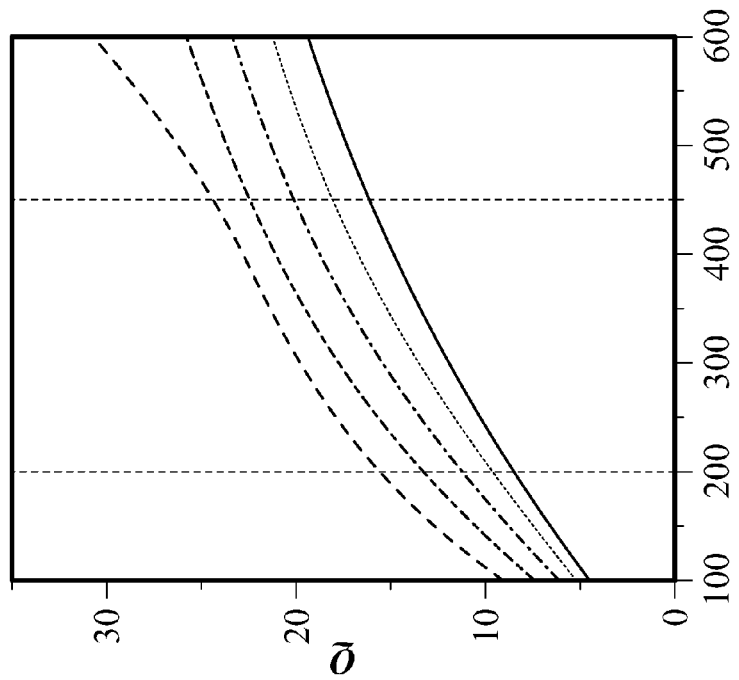
FIG. 8(a) is a graph of Q-factor of the plasmon as a function of frequency at five different normalized 2DEG densities for the GaAs/AlGaAs plasmonic material system studied.

In FIGS. 8(a) and 8(b), respectively, the plasmon Q-factor and coherence length $L_C$ calculated for the gated GaAs/AlGaAs 2DEG are plotted as a function of frequency $\nu$ for several values of the normalized carrier density $\gamma$. The Q-factor of the plasma wave is approximately 10-25 in the range of frequencies studied (200-450 GHz, shown with vertical dashed lines) and increases modestly as the 2DEG density is lowered. The coherence length, however, depends much more critically on both the 2DEG density and frequency. In the frequency range studied, LC<20 µm when $\gamma$=0.2. Because the exemplary plasmonic crystal structures are 18 µm and 22 µm in size, coherent phenomena distributed through the full PC should be inhibited as the 2DEG density is reduced. This is the case in FIG. 3(b) and FIGS. 4(b), 4(d) and 4(e) where the lifted four fold degeneracy cannot be clearly observed as $\gamma \rightarrow 0$ (alternately, $V_{Gj} \rightarrow V_{TH}$). In most of the experimentally measured phase space, however, the lifted four fold degeneracy is evident, as are repelled crossings between the defect and PC. This is strong evidence that the plasmon coherence lengths predicted in FIG. 8 are accurate and that the structures studied support a coherent, collective plasmonic excitation in most of the measured regions.

A clear indication of coherent excitation across the full length of an n-period plasmonic lattice is the observation of n modes in each crystal band. Accordingly, four and five modes per band are observed for four and five period PCs, respectively. Two modes in each incipient plasmonic crystal band were also recently demonstrated in a two period plasmonic lattice. See G. C. Dyer et al., Phys. Rev. Lett. 109, 126803 (2012). Because the coherence lengths in FIG. 8 are of the same order as the size of the PCs studied, a significantly longer structure than that of a four or five period PC is unlikely to display collective plasma resonances across the full structure. To test this hypothesis, an eight-period plasmonic lattice was studied.

Figure 9:
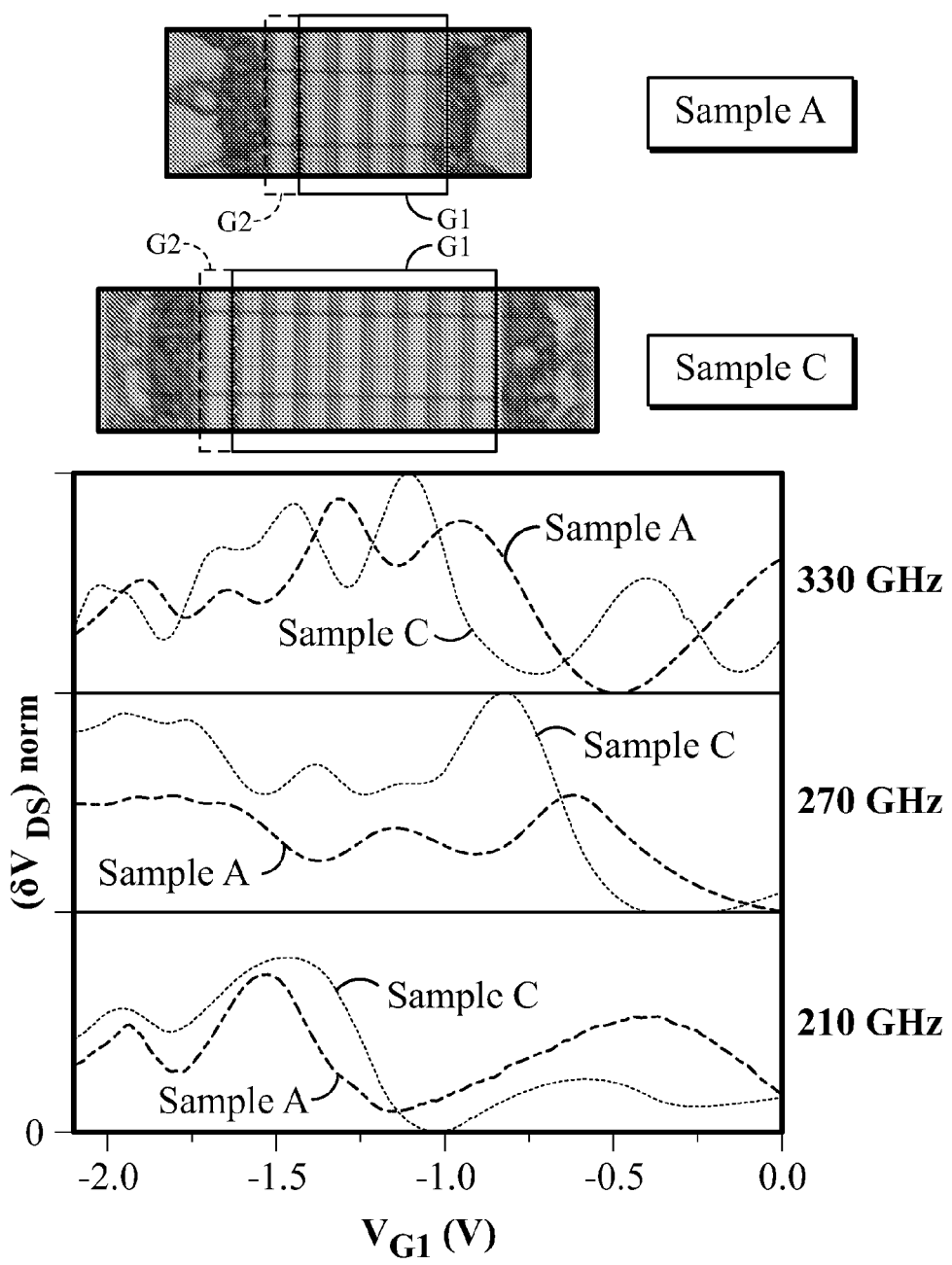
FIG. 9 is a graph of the photoresponse of Sample A (four-period lattice) and Sample C (eight-period lattice) at 210, 270 and 330 GHz. The gate G2 is biased to threshold for both samples while G1 is tuned for 0 to −2.5 V.

In FIG. 9, the homodyne mixing response of an eight-period plasmonic lattice, Sample C, is compared to that of Sample A, a four period PC, at several excitation frequencies. Here the PC is formed between G2 and the source contact, with G1 tuning the plasmonic lattice, analogous to the measurements performed in FIG. 3(a). If all eight PC unit cells in Sample C are coherently coupled, double the number of modes would be expected relative to the four period PC (Sample A). While Sample C displays additional structure in its response spectrum as well as an apparent small shift in the spectrum to lower 2DEG densities, there is no unequivocal indication of a lifted eight-fold degeneracy.

With 210 GHz excitation, there are three distinct peaks for both samples. Though there are suggestions of a peak slightly past $V_{G1}$=0 and a splitting of the peak near $V_{G1}$=−1.5, coherence across the entire eight periods of Sample C would require six distinct peaks over the measured range. The plasmonic excitation has not lost its coherence given that there are still distinct modes observed in the expected PC bands. But the coherence is not sufficient to couple all PC unit cells in the device. There is one additional resonance evident in Sample C's spectrum in comparison to Sample A's in the range 0>$V_{G1}$>−−1.75 for 270 and 330 GHz excitations. These added features in the photoresponse confirm that adding four additional periods has altered the PC spectrum, but fall short of demonstrating the long-range coherence required for an eight-period PC. For all excitation frequencies shown, the decreased coherence length at reduced 2DEG density ($V_{G1}$<−1.5) evidently precludes the observation of the additional modes in each band expected for the doubling of the number of lattice periods. This null result supports limiting the analysis to four and five period structures due to the constraints imposed by the plasmon coherence length in this material system.

Scalability of Plasmonic Crystals

Figure 10A:
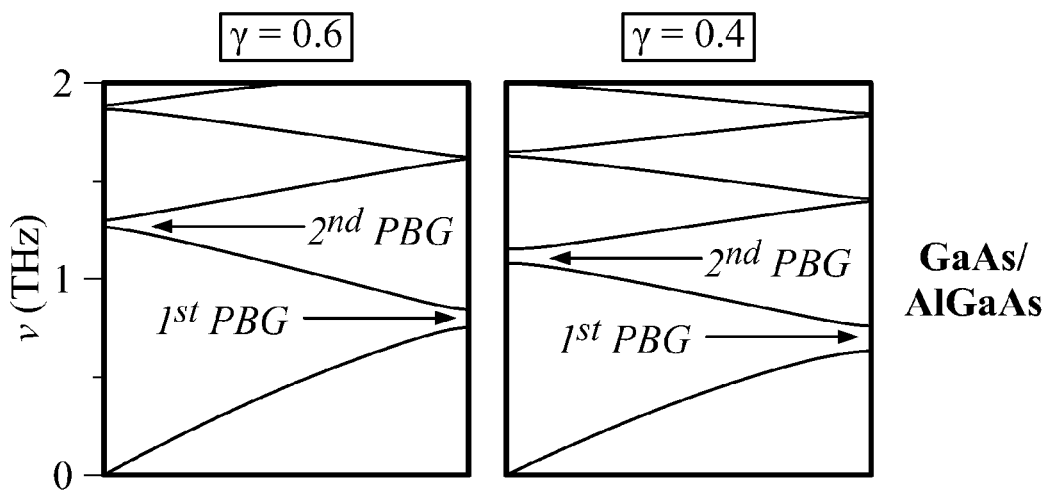
FIG. 10(a) is a graph of the scaled plasmonic crystal band structure based on typical GaAs/AlGaAs 2DEG material parameters.
Figure 10B:
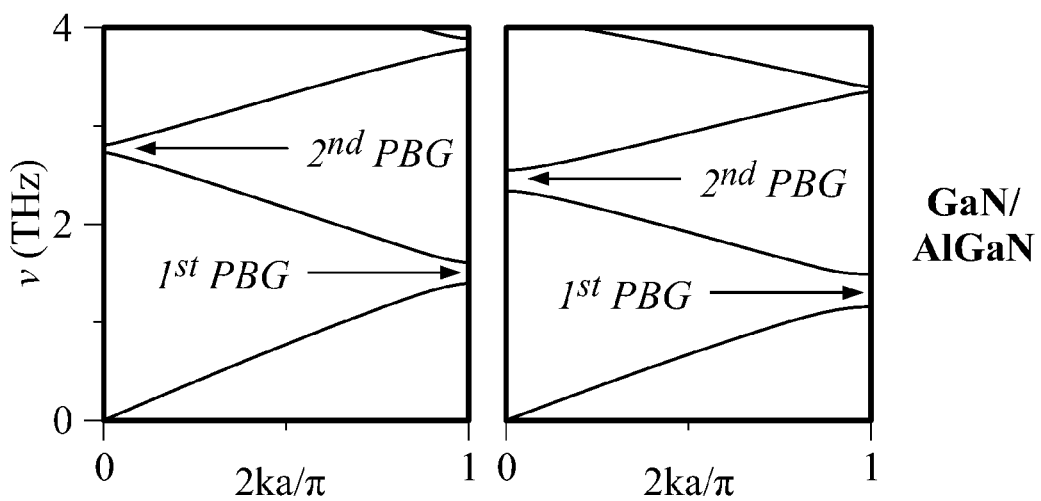
FIG. 10(b) is a graph of the scaled plasmonic crystal band structure based on typical GaN/AlGaN 2DEG material parameters. Two different normalized 2DEG densities in the gated regions of the plasmonic crystal unit cell are shown for each material, 0.4 and 0.6.

The typical plasmonic band structure of two materials, a GaAs/AlGaAs and a GaN/AlGaN 2DEG, were calculated to illustrate the scalability in frequency of plasmonic crystals. The plasmonic crystal dispersion is found from Eq. (12) using the PC unit cell illustrated in FIG. 2(c) and the same assumptions made in calculating FIG. 3(a). The results are shown in FIG. 10(a) for typical GaAs/AlGaAs and FIG. 10(b) for typical GaN/AlGaN 2DEG material parameters.

To calculate the scaled band structure for a GaAs/AlGaAs 2DEG, a gate-channel separation of d=100 nm, a region of gate-tuned 2DEG a=250 nm wide, a region of untuned 2DEG a=250 nm wide, and an intrinsic 2DEG density of n=4.0×10$^{11}$ cm$^{-2}$ were assumed. In comparison to the exemplary devices described above, this corresponds to a scaling downward in metallization feature size by a factor of 8, which can be realized using available electron beam lithography techniques, and a reduction in the setback of the 2DEG from the gate. All other parameters such as GaAs permittivity and electron effective mass are unchanged.

The band structure of a GaN/AlGaN plasmonic crystal was calculated using the parameters for a GaN/AlGaN 2DEG defined by Muravjov et al: $m^*=0.2\ m_e$, $n=7.5\times10^{12}\ cm^{-2}$, $\epsilon=9.5\ \epsilon_0$, and $d=28$ nm. See A. V. Muravjov et al., *Appl. Phys. Lett.* 96, 042105 (2010). A bipartite gated-ungated PC unit cell was also assumed with each element having width $a=250$ nm. Not only is the length scale of the crystal reduced relative to the exemplary devices, but the 2DEG density is also an order of magnitude larger. Both of these attributes serve to shift the band structure higher in frequency.

In FIG. 10(*a*), the first PBG is found around 0.7 to 0.8 THz, depending on the density tuning of the GaAs/AlGaAs 2DEG below the gated region. The second PBG occurs above 1 THz. The increase in frequency of the band structure relative to the results for the exemplary devices is entirely due to the reduction in the PC unit cell size. This serves to illustrate that for GaAs/AlGaAs 2DEGs, eventually the PC will be limited by the minimum feature size.

The choice of a GaN/AlGaN 2DEG material system in FIG. 10(*b*) affords a significant upward shift of the full band structure due to the additional increase in 2DEG density. The first PBG is above 1 THz and the second PBG is above 2 THz for both normalized 2DEG densities. This is a striking illustration of the possibility of scaling tunable plasmonic crystals to frequencies well above 1 THz.

Graphene can also be used for plasmonic crystal structures. Although the plasmon dispersion is not identical to that of semiconductor 2DEGs, conceptually identical PC systems can be realized in graphene-based plasmonic structures. Recent efforts have demonstrated infrared plasmons in graphene. See J. Chen et al., *Nature* 487, 77 (2012); and Z. Fei et al., *Nature* 487, 82 (2012). If metal structures are scaled appropriately to the graphene plasmon wavelength at a given operating frequency band, graphene infrared plasmonic crystals operating at room temperature can be provided.

The present invention has been described as a tunable plasmonic crystal. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A tunable plasmonic crystal, comprising:
   a layer providing a two-dimensional electron gas (2DEG) or a two-dimensional hole gas (2DHG), wherein the layer is formed at a semiconductor heterojunction comprising InGaAs/InAlAs, GaN/AlGaN, or GaSb/InAs;
   a periodic gate comprising at least two parallel finger electrodes disposed on the 2DEG or 2DHG layer;
   means for applying a gate voltage to the periodic gate to modulate the electron density in the 2DEG layer; or the hole density in the 2DHG layer, thereby producing a spatially periodic plasmon structure having a unit cell; and
   means to couple incident electromagnetic radiation into the 2DEG or 2DHG layer;
   wherein the spatially periodic plasmon structure produces a plasmonic band structure when interacting with the incident electromagnetic radiation.

2. A tunable plasmonic crystal, comprising:
   a layer providing a two dimensional electron gas (2DEG) or a two-dimensional hole gas (2DHG), wherein the layer is formed at a semiconductor heterojunction comprising GaAs/AlGaAs;
   a periodic gate comprising at least two parallel finger electrodes disposed on the 2DEG or 2DHG layer;
   means for applying a gate voltage to the periodic gate to modulate the electron density in the 2DEG layer or the hole density in the 2DHG layer, thereby producing a spatially periodic plasmon structure having a unit cell; and
   an antenna or an on-chip signal generator to couple incident electromagnetic radiation into the 2DEG or 2DHG layer;
   wherein the spatially periodic plasmon structure produces a plasmonic band structure when interacting with the incident electromagnetic radiation.

3. A tunable plasmonic crystal, comprising:
   a layer providing a two-dimensional electron gas (2DEG) or a two-dimensional hole gas (2DHG), wherein the layer comprises graphene;
   a periodic gate comprising at least two parallel finger electrodes disposed on the graphene layer;
   means for applying a gate voltage to the periodic gate to modulate the electron or hole density in the graphene layer, thereby producing a spatially periodic plasmon structure having a unit cell; and
   means to couple incident electromagnetic radiation into the graphene layer;
   wherein the spatially periodic plasmon structure produces a plasmonic band structure when interacting with the incident electromagnetic radiation.

4. The tunable plasmonic crystal of claim 1, 2, or 3, wherein the unit cell of the periodic plasmon structure is less than 1/10 the free space wavelength of the incident electromagnetic radiation.

5. The tunable plasmonic crystal of claim 1, 2, or 3, wherein the unit cell of the periodic plasmon structure is less than 1/100 the free space wavelength of the incident electromagnetic radiation.

6. The tunable plasmonic crystal of claim 1, 2, or 3, wherein the incident electromagnetic radiation has a frequency of between 10 GHz and 6 THz (i.e., free space wavelength of between 30 mm and 5 l~m).

7. The tunable plasmonic crystal of claim 1, 2, or 3, further comprising at least one finger electrode disposed on the 2DEG or 2DHG layer biased at a different voltage than the gate voltage, thereby forming a plasmonic defect in the tunable plasmonic crystal.

8. The tunable plasmonic crystal of claim 1, 2, or 3, wherein the layer providing the 2DEG or 2DHG is formed between a drain terminal and a source terminal.

9. The tunable plasmonic crystal of claim 1, 2, or 3, wherein the spatially periodic plasmon structure is less than a plasmon coherence length.

10. The tunable plasmonic crystal of claim 2, wherein the on-chip signal generator comprises a local oscillator or a photoconductive switch.

* * * * *